US012665033B2

(12) United States Patent
Choi et al.

(10) Patent No.: US 12,665,033 B2
(45) Date of Patent: Jun. 23, 2026

(54) PAGE BUFFER CIRCUIT AND MEMORY DEVICE INCLUDING A PAGE BUFFER CIRCUIT

(71) Applicant: SAMSUNG ELECTRONICS CO., LTD., Suwon-si (KR)

(72) Inventors: Minjie Choi, Suwon-si (KR);
Chaehoon Kim, Suwon-si (KR);
Hyunkook Park, Suwon-si (KR);
Jisang Lee, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 147 days.

(21) Appl. No.: 18/788,496

(22) Filed: Jul. 30, 2024

(65) Prior Publication Data

US 2025/0191662 A1     Jun. 12, 2025

(30) Foreign Application Priority Data

Dec. 11, 2023     (KR) ........................ 10-2023-0178746

(51) Int. Cl.
| | |
|---|---|
| *G11C 16/04* | (2006.01) |
| *G11C 16/08* | (2006.01) |
| *G11C 16/20* | (2006.01) |
| *G11C 16/26* | (2006.01) |

(52) U.S. Cl.
CPC .............. *G11C 16/26* (2013.01); *G11C 16/08*
(2013.01); *G11C 16/20* (2013.01)

(58) Field of Classification Search
CPC .......... G11C 16/26; G11C 16/08; G11C 16/20
See application file for complete search history.

(56) References Cited

U.S. PATENT DOCUMENTS

| | | | | |
|---|---|---|---|---|
| 5,193,163 | A | * | 3/1993 | Sanders .............. G06F 12/0831 |
| | | | | 711/143 |
| 6,295,583 | B1 | * | 9/2001 | Razdan .............. G06F 12/0855 |
| | | | | 711/146 |
| 6,687,158 | B2 | | 2/2004 | Yano |
| 7,016,229 | B2 | | 3/2006 | Kim |
| 7,124,236 | B1 | * | 10/2006 | Tan ..................... G06F 12/0853 |
| | | | | 711/131 |
| 9,263,137 | B2 | | 2/2016 | Lee |
| 11,646,064 | B2 | | 5/2023 | Cho et al. |
| 2006/0126387 | A1 | | 6/2006 | Kim et al. |

FOREIGN PATENT DOCUMENTS

| | | |
|---|---|---|
| KR | 10-2003-0052943 | 6/2003 |
| KR | 10-2005-0073296 | 7/2005 |

* cited by examiner

*Primary Examiner* — Pho M Luu
(74) *Attorney, Agent, or Firm* — Fish & Richardson P.C.

(57) ABSTRACT

A memory device includes a memory cell array, a plurality of page buffer units connected to the memory cell array and connected in common to a combined sensing node, and a plurality of cache latches respectively corresponding to the plurality of page buffer units, the plurality of cache latches including a first cache latch and a second cache latch connected in common to the combined sensing node. In a first section of a data dumping operation on the first cache latch, first and second tri-state inverters included in the first cache latch are enabled to transmit data to the first cache latch, and third and fourth tri-state inverters included in the second cache latch are disabled. In a second section of the data dumping operation on the first cache latch, the third and fourth tri-state inverters are sequentially enabled to restore data previously stored in the second cache latch.

20 Claims, 32 Drawing Sheets

PAGE BUFFER CIRCUIT AND MEMORY DEVICE INCLUDING A PAGE BUFFER CIRCUIT

CROSS-REFERENCE TO RELATED APPLICATION

This application is based on and claims priority under 35 U.S.C. § 119 to Korean Patent Application No. 10-2023-0178746, filed on Dec. 11, 2023, in the Korean Intellectual Property Office, the disclosure of which is incorporated by reference herein in its entirety.

BACKGROUND

With the requisition for high-capacity downscaled memory devices, a three-dimensional (3D) memory device in which a memory cell array and a peripheral circuit are arranged in a vertical direction has been developed. With the development of semiconductor processes, as the number of stacked word lines increases in a memory cell array, the area of the memory cell array is reduced. Accordingly, reducing the area of a peripheral circuit is required. In particular, there is an increased need to reduce the size of a page buffer circuit, which occupies a significantly large area in the peripheral circuit.

SUMMARY

The disclosure provides a memory device, which may reduce an area of a page buffer circuit by reducing the number of transistors included in the page buffer circuit.

According to an aspect of the disclosure, there is provided a memory device including a memory cell array, a plurality of page buffer units connected to the memory cell array and connected in common to a combined sensing node, and a plurality of cache latches respectively corresponding to the plurality of page buffer units, the plurality of cache latches including a first cache latch and a second cache latch connected in common to the combined sensing node, wherein, in a first section of a data dumping operation on the first cache latch, first and second tri-state inverters included in the first cache latch are enabled to transmit data to the first cache latch, and third and fourth tri-state inverters included in the second cache latch are disabled, and, in a second section of the data dumping operation on the first cache latch, the third and fourth tri-state inverters are sequentially enabled to restore data previously stored in the second cache latch.

According to another aspect of the disclosure, there is provided a memory device including a memory cell array, a plurality of page buffer units connected to the memory cell array and connected in common to a combined sensing node, and a plurality of cache latches respectively corresponding to the plurality of page buffer units, the plurality of cache latches being connected in common to the combined sensing node, wherein the plurality of cache latches include a first cache latch including a first tri-state inverter and a second tri-state inverter, and a second cache latch including a third tri-state inverter and a fourth tri-state inverter, wherein, in a first section of a data dumping operation on the first cache latch, the first tri-state inverter is enabled to transmit data to the first cache latch, and the second to fourth tri-state inverters are disabled, and, in a second section of the data dumping operation on the first cache latch, the third and fourth tri-state inverters are sequentially enabled to restore data previously stored in the second cache latch.

According to another aspect of the disclosure, there is provided a memory device including a memory cell array, a plurality of page buffer units connected to the memory cell array, the plurality of page buffer units being connected in common to a combined sensing node, and a plurality of cache latches respectively corresponding to the plurality of page buffer units, the plurality of cache latches being connected in common to the combined sensing node, wherein the plurality of cache latches include a first cache latch including a first tri-state inverter and a second tri-state inverter, and a second cache latch including a third tri-state inverter and a fourth tri-state inverter, wherein the first to fourth tri-state inverters are disabled in a first section of a data dumping operation on the first cache latch, and, in a second section of the data dumping operation on the first cache latch, enabling of the first and fourth tri-state inverters is followed by enabling the second and third tri-state inverters, and data previously stored in the second cache latch is restored.

BRIEF DESCRIPTION OF THE DRAWINGS

Implementations will be more clearly understood from the following detailed description taken in conjunction with the accompanying drawings in which:

FIG. 2 is a circuit diagram of a memory block according to some implementations;

FIG. 5 is a detailed circuit diagram of a page buffer according to some implementations;

FIG. 6 is a detailed circuit diagram of a page buffer according to some implementations;

FIG. 22 illustrates a discharge operation according to some implementations;

DETAILED DESCRIPTION

Figure 1:
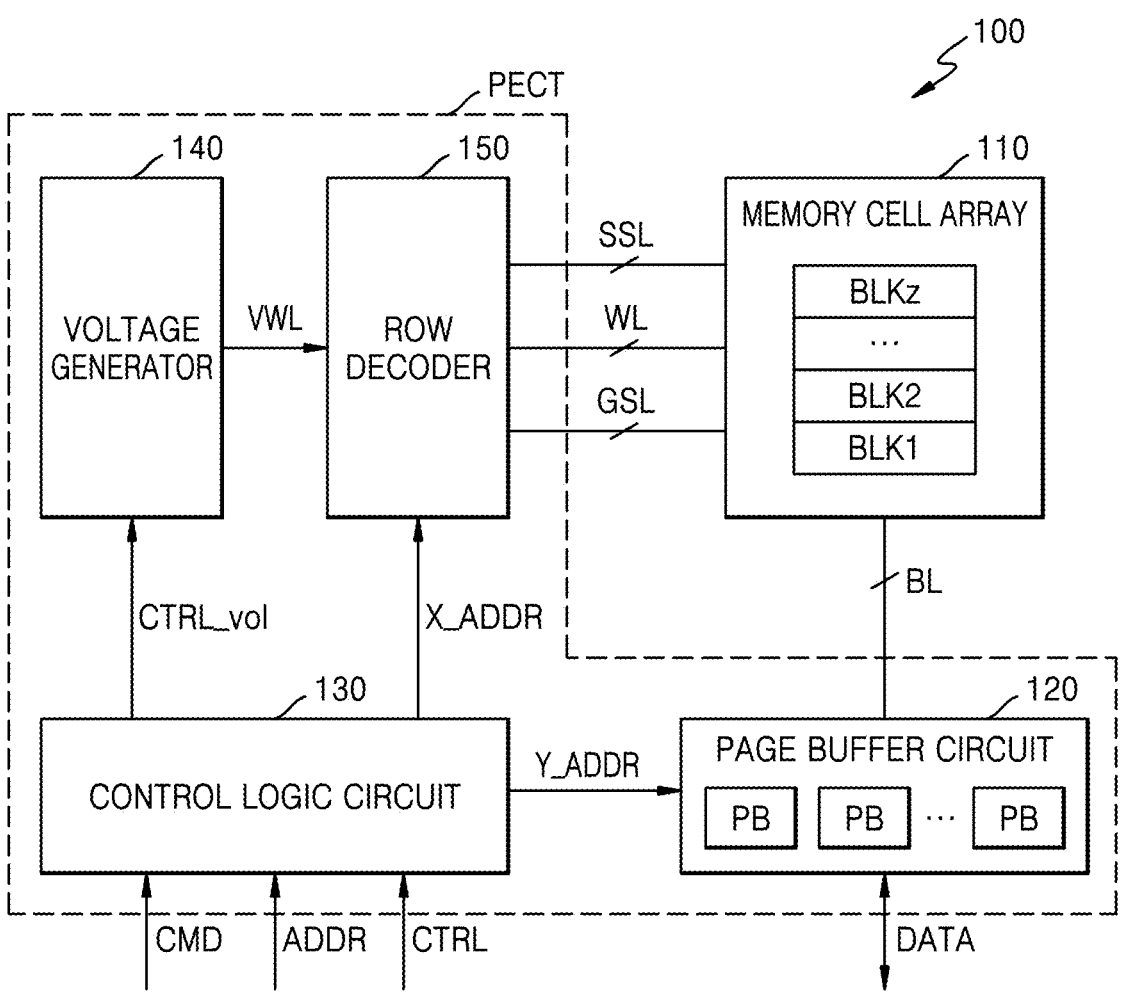
FIG. 1 is a block diagram of a memory device according to some implementations.

Hereinafter, implementations will be described in detail with reference to the accompanying drawings. The same reference numerals are used to denote the same elements in the drawings, and repeated descriptions thereof are omitted.

FIG. 1 is a block diagram of a memory device 100 according to some implementations. Referring to FIG. 1, the memory device 100 includes a memory cell array 110 and a peripheral circuit PECT, and the peripheral circuit PECT includes a page buffer circuit 120, a control logic circuit 130, a voltage generator 140, and a row decoder 150. As used herein, the memory device 100 may be referred to as a "nonvolatile memory device."

The memory cell array 110 includes a plurality of memory blocks BLK1 to BLKz (z is a positive integer), each of which includes memory cells. For example, the memory cells may be flash memory cells. Hereinafter, implementations in which the memory cells are NAND flash memory cells are described in detail. However, the disclosure is not limited thereto. In some implementations, the memory cells may include resistive memory cells, such as resistive RAM (ReRAM) cells, phase-change RAM (PRAM) cells, or magnetic RAM (MRAM) cells.

The page buffer circuit 120 includes page buffers PB. Each of the page buffers PB may be connected to the memory cells of the memory cell array 110 through a bit line BL corresponding thereto. The page buffer circuit 120 may select some of bit lines BL in response to a column address Y_ADDR received from the control logic circuit 130. Each of the page buffers PB may operate as a write driver or a sense amplifier. For example, during a program operation, each of the page buffers PB may store data DATA in the memory cell by applying, to the bit line BL, a voltage corresponding to the data DATA to be programmed. For example, during a program verification operation or a read operation, each of the page buffers PB may sense programmed data DATA by sensing current or a voltage of the bit line BL.

Figure 4:
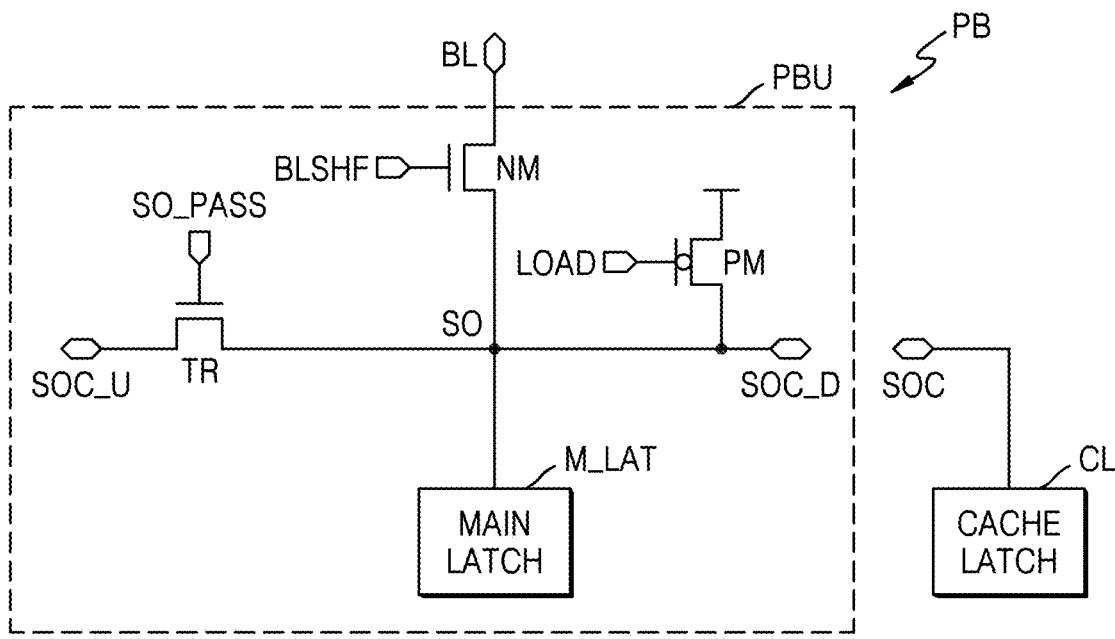
FIG. 4 is a circuit diagram of a page buffer according to some implementations.

According to some implementations, the page buffers PB may be arranged to have a multi-stage structure, and each of the page buffers PB may have a page buffer unit-cache latch separation structure in which a page buffer unit (e.g., PBU in FIG. 4) including a main latch (e.g., M_LAT in FIG. 4) is separated from a cache latch (e.g., CL in FIG. 4). In the multi-stage structure, a plurality of cache latches arranged in a line may share a combined sensing node (e.g., SOC in FIG. 4), and thus, the page buffer circuit 120 may be implemented as a shared SOC structure. To reduce an area of the page buffer circuit 120, the number of transistors included in the cache latch of each of the page buffers PB may be reduced compared to the number of transistors included in a typical cache latch. In this case, various control operations on the page buffer PB are described in detail with reference to FIGS. 7 to 24B.

The control logic circuit 130 may output a voltage control signal CTRL_vol, a row address X_ADDR, and the column address Y_ADDR to perform memory operations (e.g., the program operation, the read operation, and/or an erase operation) on the memory cell array 110, based on, for example, a command CMD, an address ADDR, and a control signal CTRL, which are received from a memory controller. The voltage generator 140 may generate word line voltages VWL for performing the memory operations, based on the voltage control signal CTRL_vol. In response to the row address X_ADDR received from the control logic circuit 130, the row decoder 150 may select one of the memory blocks BLK1 to BLKz, select one of word lines WL of the selected memory block, and select one of string selection lines SSL.

Figure 2:
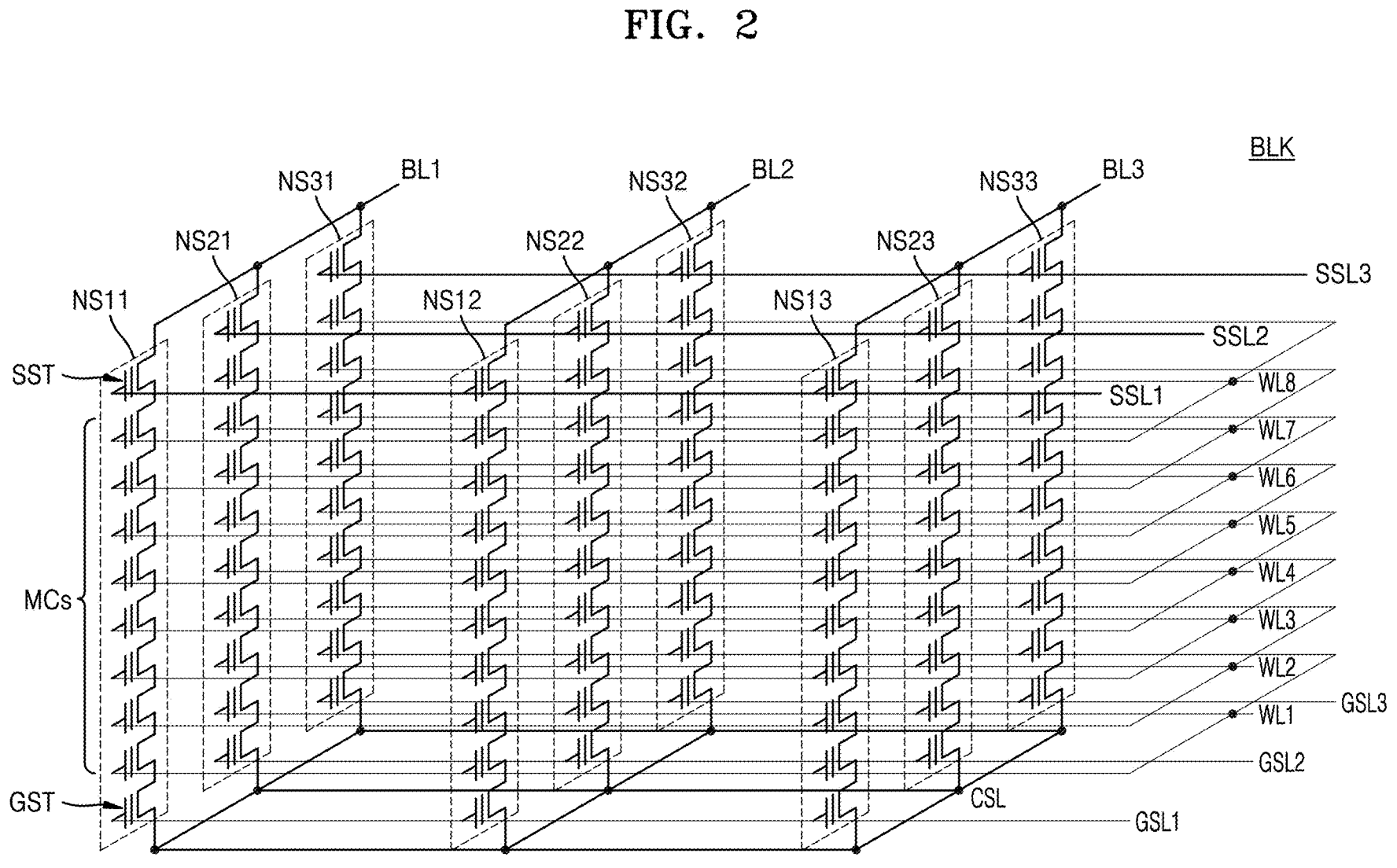

FIG. 2 is a circuit diagram of a memory block BLK according to some implementations. Referring to FIG. 2, the memory block BLK may correspond to one of the memory blocks BLK1 to BLKz of FIG. 1. The memory block BLK includes NAND strings NS11 to NS33, each (e.g., NS11) of which includes a string selection transistor SST, memory cells MCs, and a ground selection transistor GST, which are connected in series. The string selection transistors SST, the ground selection transistor GST, and the memory cells MCs, which are included in each of the NAND strings NS11 to NS33, may be stacked on a substrate in a vertical direction.

The string selection transistor SST may be connected to string selection lines SSL1 to SSL3 corresponding thereto. Each of the memory cells MCs may be connected to a corresponding one of word lines WL1 to WL8. The ground selection transistor GST may be connected to ground selection lines GSL1 to GSL3 corresponding thereto. The string selection transistor SST may be connected to a bit line corresponding thereto, and the ground selection transistor GST may be connected to a common source line CSL. Herein, the number of NAND strings, the number of word lines, the number of bit lines, the number of ground selection lines, and the number of string selection lines may be variously changed according to some implementations.

The following patent documents, which are hereby incorporated by reference, disclose suitable configurations of three-dimensional memory cell arrays, in which the three-dimensional memory cell array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
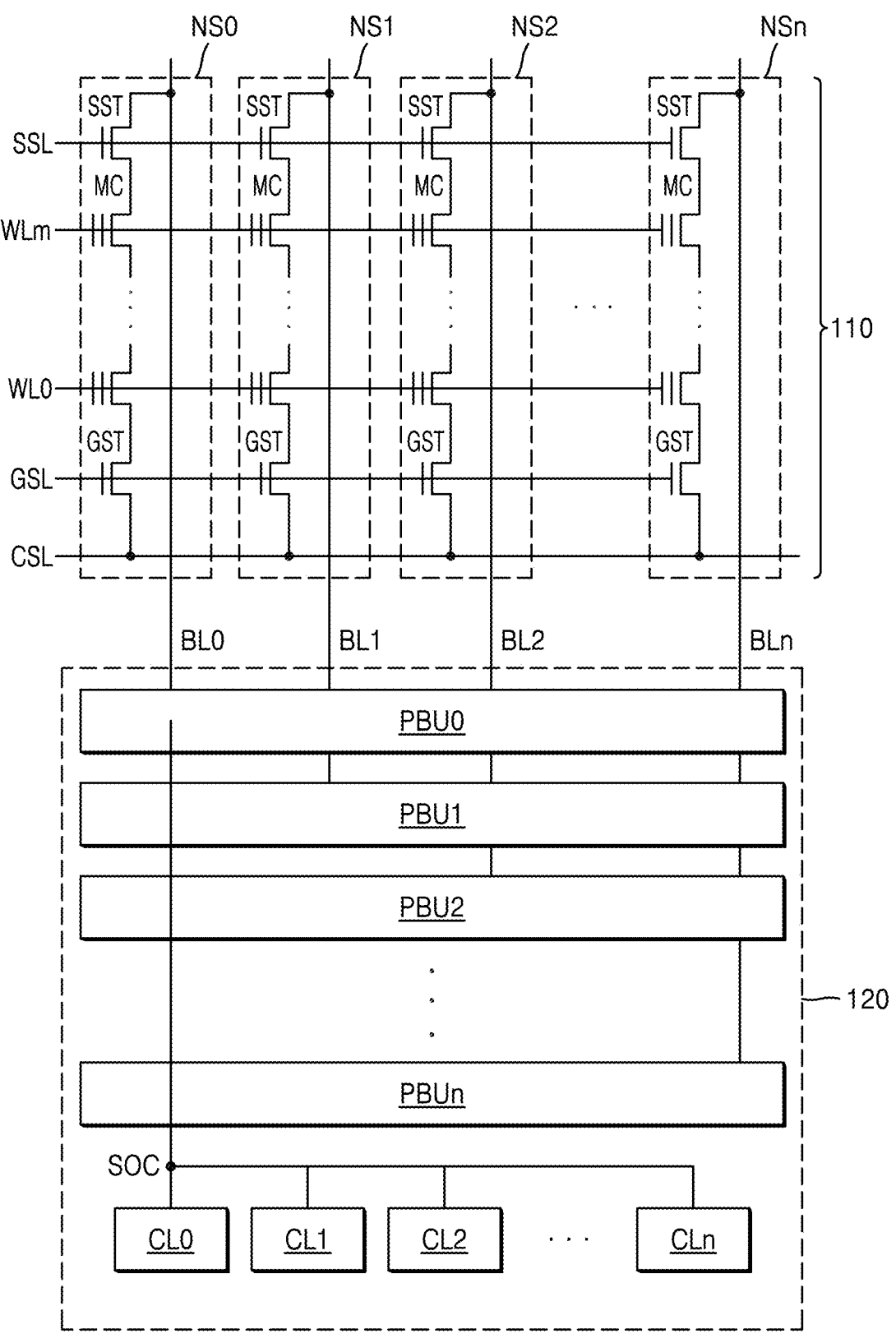
FIG. 3 illustrates the connection of a memory cell array to a page buffer circuit, according to some implementations.

FIG. 3 illustrates the connection of a memory cell array 110 to a page buffer circuit 120, according to some implementations. Referring to FIG. 3, the memory cell array 110 includes first to n+1-th NAND strings NS0 to NSn, and each of the first to n+1-th NAND strings NS0 to NSn includes a ground selection transistor GST connected to a ground selection line GSL, memory cells MC respectively connected to word lines WL0 to WLm, and a string selection transistor SST connected to a string selection line SSL (each of n and m is a positive integer).

The page buffer circuit 120 includes first to n+1-th page buffer units PBU0 to PBUn. The first page buffer unit PBU0 may be connected to the first NAND string NS0 through a first bit line BL0, and the n+1-th page buffer unit PBUn may be connected to the n+1-th NAND string NSn through an n+1-th bit line BLn. The page buffer circuit 120 may further include first to n+1-th cache latches CL0 to CLn, which respectively correspond to the first to n+1-th page buffer units PBU0 to PBUn. For example, n may be 7, and the page buffer circuit 120 may have a structure in which page buffer units PBU0 to PBU7 are arranged in a line in eight stages and cache latches CL0 to CL7 are arranged in a line in eight stages.

Respective sensing nodes of the first to n+1-th page buffer units PBU0 to PBUn may be connected in common to a combined sensing node SOC, and the first to n+1-th cache latches CL0 to CLn may also be connected in common to the combined sensing node SOC. Accordingly, the first to n+1-th page buffer units PBU0 to PBUn may be connected to the first to n+1-th cache latches CL0 to CLn through the combined sensing node SOC.

FIG. 4 is a circuit diagram of a page buffer PB according to some implementations. Referring to FIG. 4, the page buffer PB may correspond to an example of the page buffer PB of FIG. 1. The page buffer PB includes a page buffer unit PBU and a cache latch CL. Because the cache latch CL is connected to a data input/output (I/O) line, the cache latch CL may be adjacent to the data I/O line. Accordingly, the page buffer unit PBU and the cache latch CL may be apart from each other, and the page buffer PB may have a structure in which the page buffer unit PBU is separated from the cache latch CL.

The page buffer unit PBU includes a main latch M_LAT, a bit line shut-off transistor NM, a precharge transistor PM, and a pass transistor TR. The bit line shut-off transistor NM may be connected to a bit line BL and may be driven in response to a bit line shut-off signal BLSHF. When the bit line shut-off transistor NM is turned on, a sensing node SO may be connected to the bit line BL. The precharge transistor PM may be driven in response to a load signal LOAD, and the sensing node SO may be precharged when the precharge transistor PM is turned on. The pass transistor TR may be driven in response to a pass control signal SO_PASS. When the pass transistor TR is turned on, the sensing node SO may be connected to first and second terminals SOC_U and SOC_D.

Figure 5:
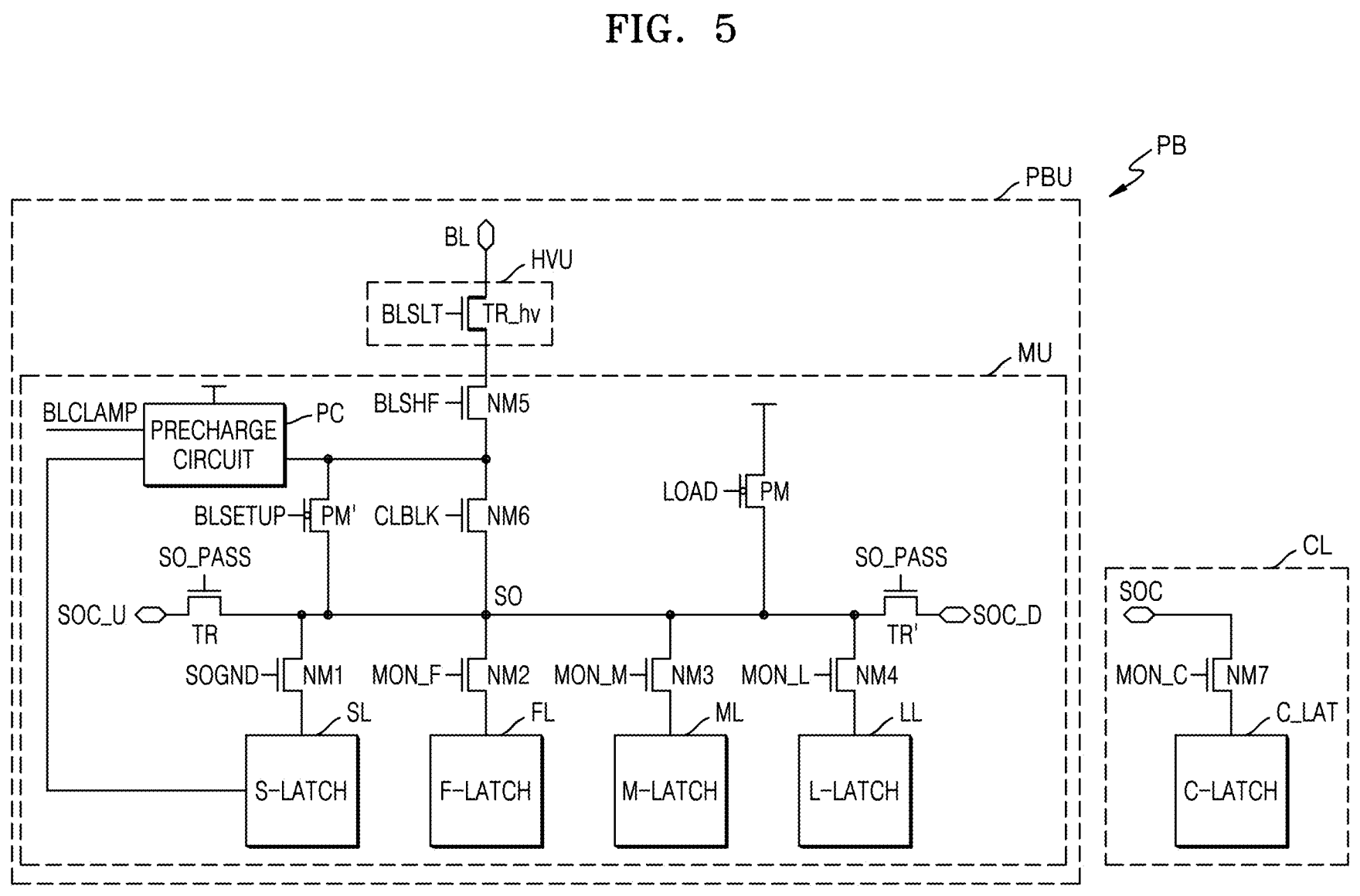

FIG. 5 is a detailed circuit diagram of a page buffer PB according to some implementations. Referring to FIG. 5, the page buffer PB includes a page buffer unit PBU and a cache latch CL, and the cache latch CL includes a latch (C-LATCH) C_LAT. The page buffer PB may correspond to an example of the page buffer PB of FIG. 4. The page buffer unit PBU includes a main unit MU. The page buffer unit PBU may further include a bit line selection transistor TR_hv, which is connected to a bit line BL and driven in response to a bit line selection signal BLSLT. The bit line selection transistor TR_hv may be implemented as a high-voltage transistor and located in a well region (i.e., a high-voltage unit HVU) that is different from the main unit MU.

The main unit MU includes a sensing latch (S-LATCH) SL, a force latch (F-LATCH) FL, an upper bit latch (M-LATCH) ML, and a lower bit latch (L-LATCH) LL. The main latch M_LAT of FIG. 4 may correspond to the sensing latch SL, the force latch FL, the upper bit latch ML, or the lower bit latch LL. A transistor NM1 may be connected between a sensing node SO and the sensing latch SL and be driven in response to a ground control signal SOGND. A transistor NM2 may be connected between the sensing node SO and the force latch FL and be driven in response to a force ground signal MON_F. A transistor NM3 may be connected between the sensing node SO and the upper bit latch ML and be driven in response to an upper bit ground signal MON_M. A transistor NM4 may be connected between the sensing node SO and the lower bit latch LL and be driven in response to a lower bit ground signal MON_L.

During a read operation or a program verification operation, the sensing latch SL may store data stored in a memory cell or a sensing result of a threshold voltage of the memory cell. During a program operation, the sensing latch SL may be used to apply a program bit line voltage or a program inhibition voltage to the bit line BL. The force latch FL may store force data and be used to improve a threshold voltage distribution during the program operation. The upper bit latch ML, the lower bit latch LL, and the cache latch CL may be used to store externally input data during the program operation. During a read operation, the cache latch CL may receive data read from the memory cell from the sensing latch SL and output the received data to the outside through a data I/O line.

A precharge circuit PC may control a precharge operation on the bit line BL or the sensing node SO based on a bit line clamping control signal BLCLAMP. A transistor PM' may be driven in response to a bit line setup signal BLSETUP, a transistor NM5 may be driven in response to a bit line shut-off signal BLSHF, and a transistor NM6 may be driven in response to a bit line connection control signal CLBLK. A precharge transistor PM may be connected to the sensing node SO, be driven in response to a load signal LOAD, and precharge the sensing node SO in a precharge section (e.g., PRECH of FIG. 18).

The main unit MU may further include a pair of pass transistors (e.g., first and second pass transistors TR and TR'), which are connected to the sensing node SO. The first and second pass transistors TR and TR' may be driven in response to a pass control signal SO_PASS. The first pass transistor TR may be connected between a first terminal SOC_U and the sensing node SO, and the second pass transistor TR' may be connected between the sensing node SO and a second terminal SOC_D. For example, when the page buffer unit PBU is a second page buffer unit PBU1 of FIG. 8, the first terminal SOC_U may be connected to one end of a pass transistor included in a first page buffer unit PBU0, and the second terminal SOC_D may be connected to one end of a pass transistor included in a third page buffer unit. Accordingly, the sensing node SO may be electrically connected to a combined sensing node SOC through pass transistors respectively included in third to n+1-th page buffer units.

Figure 6:
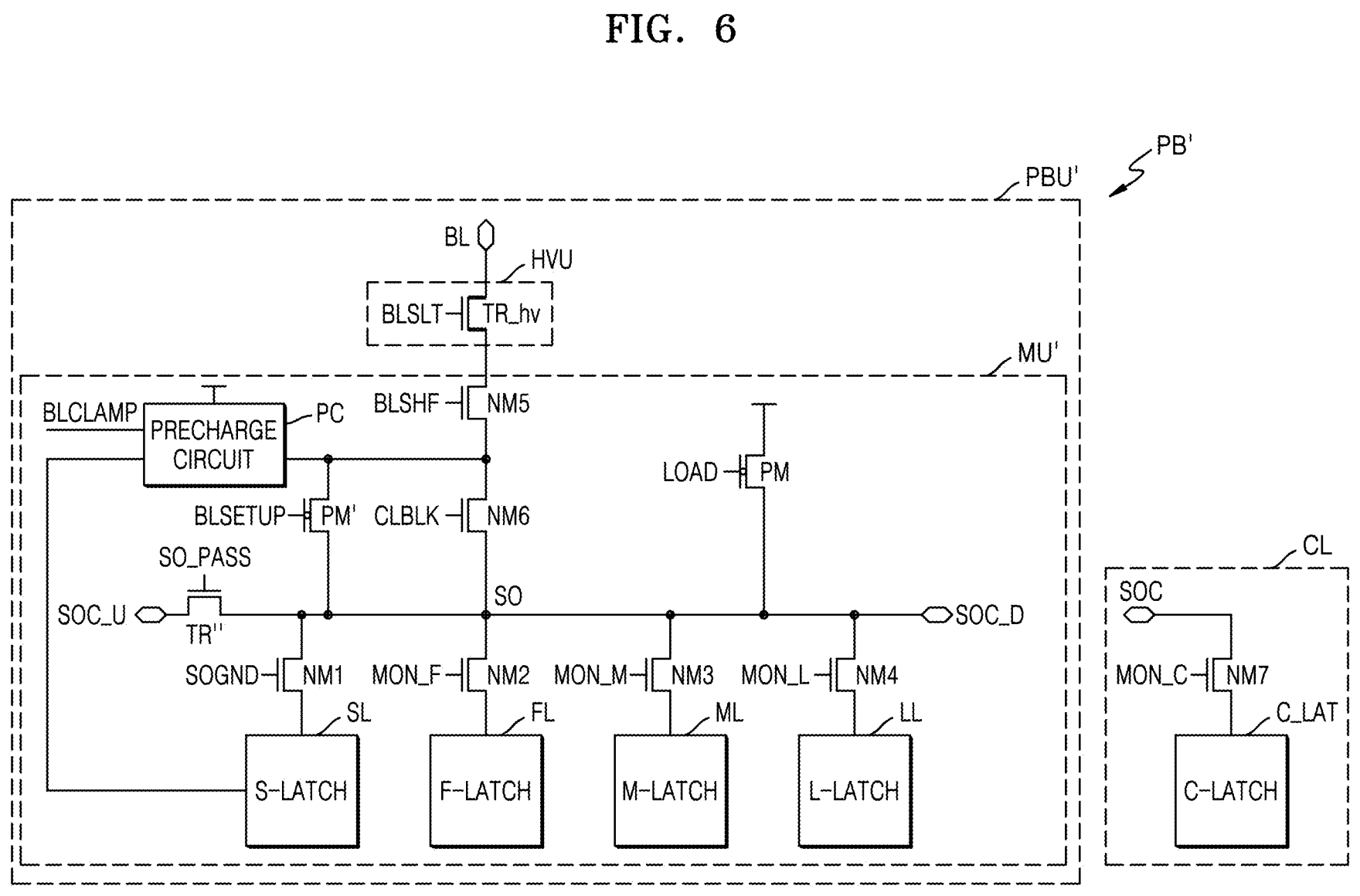

FIG. 6 is a detailed circuit diagram of a page buffer PB' according to some implementations. Referring to FIG. 6, the page buffer PB' includes a page buffer unit PBU' and a cache latch CL, and the page buffer unit PBU' includes a main unit MU' and a high-voltage unit HVU. The page buffer PB' may correspond to a modified example of the page buffer PB of FIG. 5. The page buffer unit PBU of FIG. 5 includes first and second pass transistors TR and TR', while the page buffer unit PBU' according to some implementations may include one pass transistor TR". The pass transistor TR" may be driven in response to a pass control signal SO_PASS and be connected between a first terminal SOC_U and a second terminal SOC_D. For example, a source of the pass transistor TR" may be connected to the first terminal SOC_U, and a drain of the pass transistor TR" may be connected to a sensing node SO and the second terminal SOC_D. However, the disclosure is not limited thereto, and the source of the pass transistor TR" may be connected to the first terminal SOC_U and the sensing node SO, and the drain of the pass transistor TR" may be connected to the second terminal SOC_D.

Figure 7:
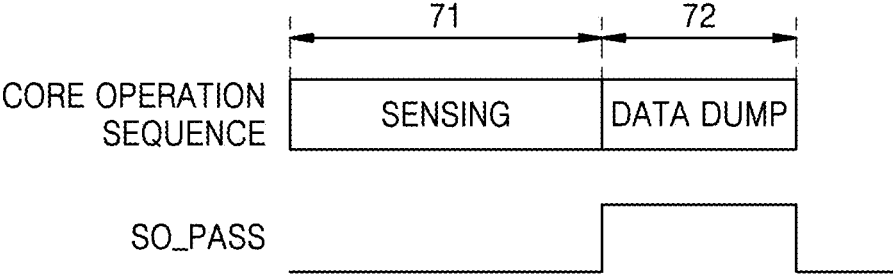
FIG. 7 is a timing diagram of an example of a voltage level of a pass control signal in a core operation sequence, according to some implementations.

FIG. 7 is a timing diagram of an example of a voltage level of a pass control signal in a core operation sequence, according to some implementations. Referring to FIGS. 4 and 7 together, the core operation sequence may indicate an operation of the page buffer PB. For example, the core operation sequence includes a data sensing section 71 in which a data sensing operation is performed and a data dumping section 72 in which a data dumping operation or a data transmission operation is performed.

In the data sensing section 71, a pass control signal SO_PASS may be disabled, and the pass transistor TR may be turned off. Accordingly, the page buffer unit PBU may not be electrically connected to a combined sensing node SOC, and the page buffer unit PBU may not be electrically connected to a cache latch CL. Also, the page buffer unit PBU may not be electrically connected to a page buffer unit adjacent thereto. For example, the data sensing section 71 may include a precharge section in which a voltage of a bit line BL or a sensing node SO is precharged to a precharge level, a development section in which the voltage of the sensing node SO is developed by electrically connecting the bit line BL to the sensing node SO, and a sensing section in which the voltage of the sensing node SO is sensed.

In the data dumping section 72, the pass control signal SO_PASS may be enabled, and the pass transistor TR may be turned on. Accordingly, the page buffer unit PBU may be electrically connected to the combined sensing node SOC, and the page buffer unit PBU may be electrically connected to the cache latch CL. Also, the page buffer unit PBU may be electrically connected to a page buffer unit adjacent thereto. For example, the data dumping section 72 may include a section in which an operation of dumping read data stored in the main latch M_LAT to the cache latch CL is performed, a section in which an operation of dumping program data stored in the cache latch CL to the main latch M_LAT is performed, or a section in which data stored in the cache latch CL is transmitted to a data I/O circuit.

Figure 8:
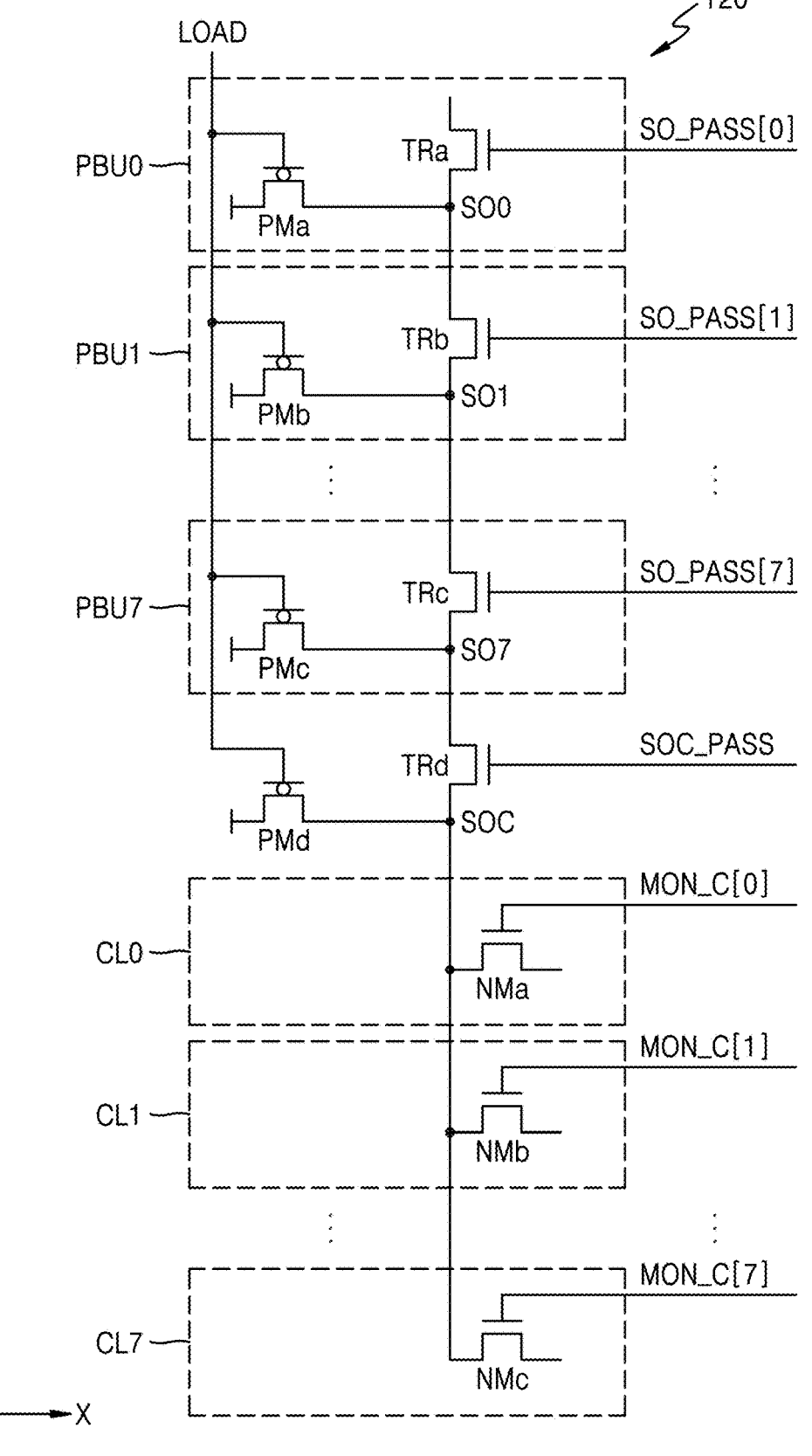
FIG. 8 illustrates a multi-stage structure of a page buffer circuit according to some implementations.

FIG. 8 illustrates a multi-stage structure of a page buffer circuit 120 according to some implementations.

Referring to FIG. 8, the page buffer circuit 120 includes first to eighth page buffer units PBU0 to PBU7 and first to eighth cache latches CL0 to CL7. Each of the first to eighth page buffer units PBU0 to PBU7 may include at least one pass transistor, and pass transistors may be driven in response to a pass control signal SO_PASS [7:0]. For example, the first page buffer unit PBU0 includes a first pass transistor TRa connected to a first sensing node SO0, the second page buffer unit PBU1 includes a second pass transistor TRb connected to a second sensing node SO1, and the eighth page buffer unit PBU7 includes an eighth pass transistor TRc connected to an eighth sensing node SO7. When the pass control signal SO_PASS [7:0] is enabled, first to eighth pass transistors TRa to TRc may be turned on. Thus, the first to eighth pass transistors TRa to TRc may be connected in series to each other, and first to eighth sensing nodes SO0 to SO7 may be connected to each other.

The page buffer circuit 120 may further include a pass transistor TRd. The pass transistor TRd may be driven in response to a pass control signal SOC_PASS, and a combined sensing node SOC may be connected to the first to eighth sensing nodes SO0 to SO7 when the pass transistor TRd is turned on. When the first to eighth pass transistors TRa to TRc and the pass transistor TRd are turned on, the first to eighth sensing nodes SO0 to SO7 and the combined sensing node SOC may be connected to each other to constitute a "data transmission line." As described above, according to some implementations, the page buffer circuit 120 may not need to separately include eight data transmission lines configured to connect the first to eighth page buffer units PBU0 to PBU7 to first to eighth cache units CU0 to CU7, respectively, and a signal line corresponding to a sensing node included in each of the first to eighth page buffer units PBU0 to PBU7 may be used as a data transmission line. As a result, the number of metal lines required for wirings of the page buffer circuit 120 may be reduced, and thus, a size of the page buffer circuit 120 may be reduced.

Each of the first to eighth cache latches CL0 to CL7 may include a monitor transistor, and the monitor transistors may be driven in response to a cache monitoring signal MON_C [7:0]. For example, the first cache latch CL0 includes a first monitor transistor NMa, the second cache latch CL1 includes a second monitor transistor NMb, and the eighth cache latch CL7 includes an eighth monitor transistor NMc. The first to eighth monitor transistors NMa to NMc included in the first to eighth cache latches CL0 to CL8 may be connected in parallel to each other and connected in common to the combined sensing node SOC. Specifically, respective sources of the first to eighth monitor transistors NMa to NMc may be connected in common to the combined sensing node SOC.

The first to eighth page buffer units PBU0 to PBU7 may further include precharge transistors PMa to PMc, respectively. For example, in a first page buffer unit PBU0, the precharge transistor PMa may be connected between a precharge terminal to which a voltage having a precharge level is applied and the first sensing node SO0 and have a gate to which a load signal LOAD is applied. The precharge transistor PMa may precharge a voltage of the first sensing node SO0 to a precharge level in response to the load signal LOAD. The page buffer circuit 120 may further include a precharge transistor PMd. The precharge transistor PMd may be connected between a precharge terminal and the combined sensing node SOC and have a gate to which the load signal LOAD is applied. The precharge transistor PMd may precharge a voltage of the combined sensing node SOC to a precharge level in response to the load signal LOAD.

Figure 9:
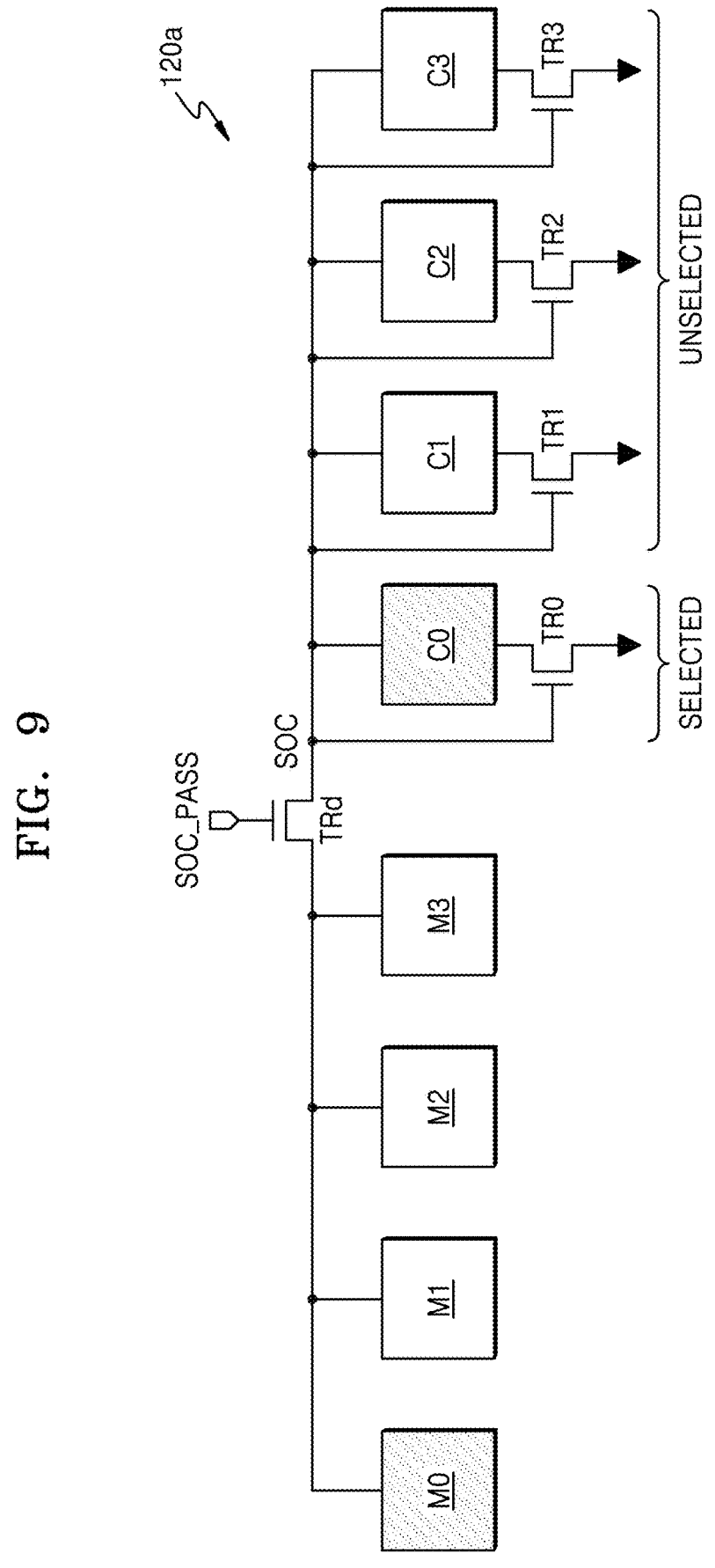
FIG. 9 illustrates the connection of main latches to cache latches, according to some implementations.

FIG. 9 illustrates the connection of main latches to cache latches, according to some implementations.

Referring to FIG. 9, a page buffer circuit 120a may include a plurality of main latches including first to fourth main latches M0 to M3 and a plurality of cache latches including first to fourth cache latches C0 to C3. Although the first to fourth main latches M0 to M3 and the first to fourth cache latches C0 to C3 are illustrated for brevity, the page buffer circuit 120a may be implemented as an eight-stage structure in which first to eighth main latches and first to eighth cache latches are arranged in a line as shown in FIG. 8. However, the disclosure is not limited thereto. For example, the page buffer circuit 120a may be implemented in various stages, such as a four-stage structure or a six-stage structure.

A pass transistor TRd may be between the first to fourth main latches M0 to M3 and the first to fourth cache latches C0 to C3. The pass transistor TRd may be driven in response to a pass control signal SOC_PASS and correspond to, for example, the pass transistor TRd of FIG. 8. For example, the pass transistor TRd may be turned off in a data sensing section 71 of FIG. 7. For example, in a data dumping section 72 of FIG. 7, the pass transistor TRd may be turned on, and a combined sensing node SOC may be connected to respective sensing nodes of the first to fourth main latches M0 to M3.

The first to fourth main latches M0 to M3 may be connected in common to the combined sensing node SOC through the pass transistor TRd. Each of the first to fourth main latches M0 to M3 may correspond to, for example, the main latch LT of FIG. 4 or the sensing latch SL, the force latch FL, the upper bit latch ML, or the lower bit latch LL of FIGS. 5 and 6. The first to fourth cache latches C0 to C3 may be connected in common to the combined sensing node SOC. Also, the first to fourth cache latches C0 to C3 may be respectively connected to first to fourth transistors TR0 to TR3. For example, the first cache latch C0 and the first transistor TR0 may correspond to the cache latch CL of FIGS. 4, 5, and 6 or the first cache latch CL0 of FIG. 8.

A gate of each of the first to fourth transistors TR0 to TR3 may be connected to the combined sensing node SOC, and the first to fourth transistors TR0 to TR3 may be turned on or off according to a voltage of the combined sensing node SOC. For example, during a data dumping operation on the first cache latch C0, that is, when data is transmitted from the first main latch M0 to the first cache latch C0, the first cache latch C0 may be a selected cache latch, and the remaining cache latches including second to fourth cache latches C1 to C3 may be unselected cache latches. For example, when the voltage of the combined sensing node SOC is at a high level, the first to fourth transistors TR0 to TR3 may be all turned on, and thus, data that is previously stored in the unselected second to fourth cache latches C1 to C3 may be damaged.

Figure 10:
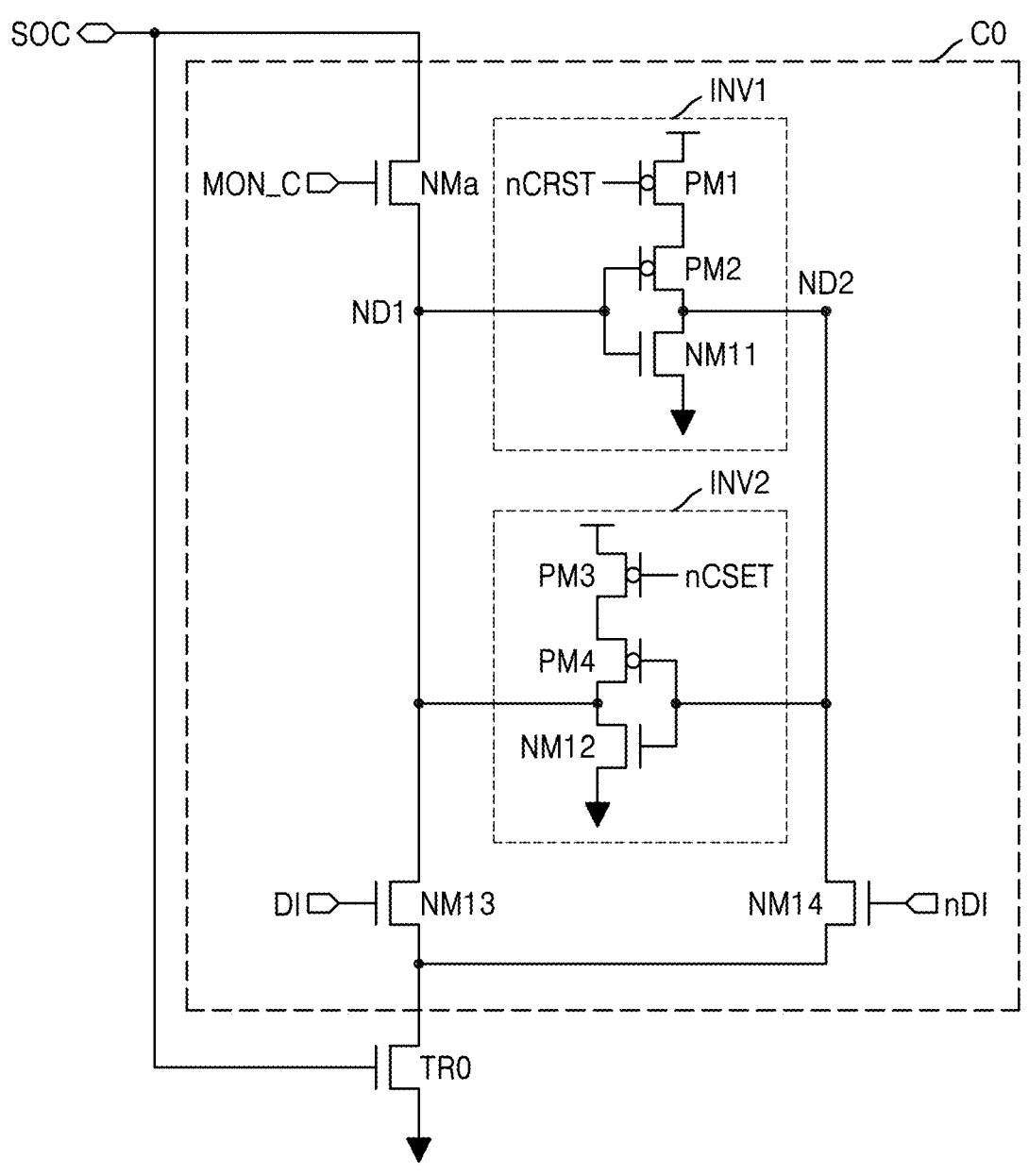
FIG. 10 is a circuit diagram of a first cache latch according to some implementations.

FIG. 10 is a circuit diagram of a first cache latch C0 according to some implementations. Referring to FIG. 10, the first cache latch C0 may correspond to the first cache latch C0 of FIG. 9. A configuration of the first cache latch C0 described below may also be applied to other cache latches including the second to fourth cache latches C1 to C3 of FIG. 9. The first cache latch C0 includes a first tri-state inverter INV1 and a second tri-state inverter INV2, and the first tri-state inverter INV1 and the second tri-state inverter INVT2 may be cross-coupled to each other between a first node ND1 and a second node ND2. The first tri-state inverter INV1 may generate an output signal by inverting an input signal received from the first node ND1 and provide the generated output signal to the second node ND2. The second tri-state inverter INV2 may generate an output signal by inverting an input signal received from the second node ND2 and provide the generated output signal to the first node ND1. Accordingly, the first and second tri-state inverters INV1 and INV2, which are cross-coupled to each other, may constitute a latch (e.g., C_LAT in FIG. 5).

The first tri-state inverter INV1 includes PMOS transistors PM1 and PM2 and an NMOS transistor NM11, which are connected in series. The PMOS transistor PM1 may include a gate configured to receive a reset control signal nCRST and a source configured to receive a power supply voltage. The PMOS transistor PM2 may include a gate connected to the first node ND1 and a drain connected to the second node ND2. The NMOS transistor NM11 may include a gate connected to the first node ND1, a source configured to receive a ground voltage, and a drain connected to the second node ND2. The first tri-state inverter INV1 may be driven in response to a reset control signal nCRST. For example, when the reset control signal nCRST is at an enabled level, the first tri-state inverter INV1 may be enabled and perform an inverting operation. For example, when the reset control signal nCRST is at a disabled level, the first tri-state inverter INV1 may be disabled and may not perform an inverting operation.

The second tri-state inverter INV2 includes PMOS transistors PM3 and PM4 and an NMOS transistor NM12, which are connected in series. The PMOS transistor PM3 may include a gate configured to receive a set control signal nCSET and a source configured to receive a power supply voltage. The PMOS transistor PM4 may include a gate connected to the second node ND2 and a drain connected to the first node ND1. The NMOS transistor NM12 may include a gate connected to the second node ND2, a source configured to receive a ground voltage, and a drain connected to the first node ND1. The second tri-state inverter INV2 may be driven in response to the set control signal nCSET. For example, when the set control signal nCSET is at an enabled level, the second tri-state inverter INV2 may be enabled and perform an inverting operation. For example, when the set control signal nCSET is at a disabled level, the second tri-state inverter INV2 may be disabled and may not perform an inverting operation.

Configurations of the first and second tri-state inverters INV1 and INV2 may vary depending on some implementations. For example, the number of PMOS transistors and/or the number of NMOS transistors in each of the first and second tri-state inverters INV1 and INV2 may vary depending on some implementations. The modified implementations for the first and second tri-state inverters INV1 and INV2 are described below in further detail with reference to FIG. 11.

The first cache latch C0 may further include a first monitor transistor NMa. The first monitor transistor NMa may be driven in response to a cache monitoring signal MON_C and control connection between a combined sensing node SOC and the first node ND1. However, the disclosure is not limited thereto. For example, as in the implementations shown in FIGS. 5 and 6, the first monitor transistor NMa may be defined as a component outside the first cache latch C0. In this case, the first monitor transistor NMa may control connection between the combined sensing node SOC and the first cache latch C0.

The first cache latch C0 may further include a set transistor NM13 and a reset transistor NM14. The set transistor NM13 may be driven in response to a set signal or a data signal DI, and the reset transistor NM14 may be driven in response to a reset signal or a data inverted signal nDI.

Voltage levels of the first and second nodes ND1 and ND2 may be determined according to the data signal DI and the data inverted signal nDI.

Figure 11:
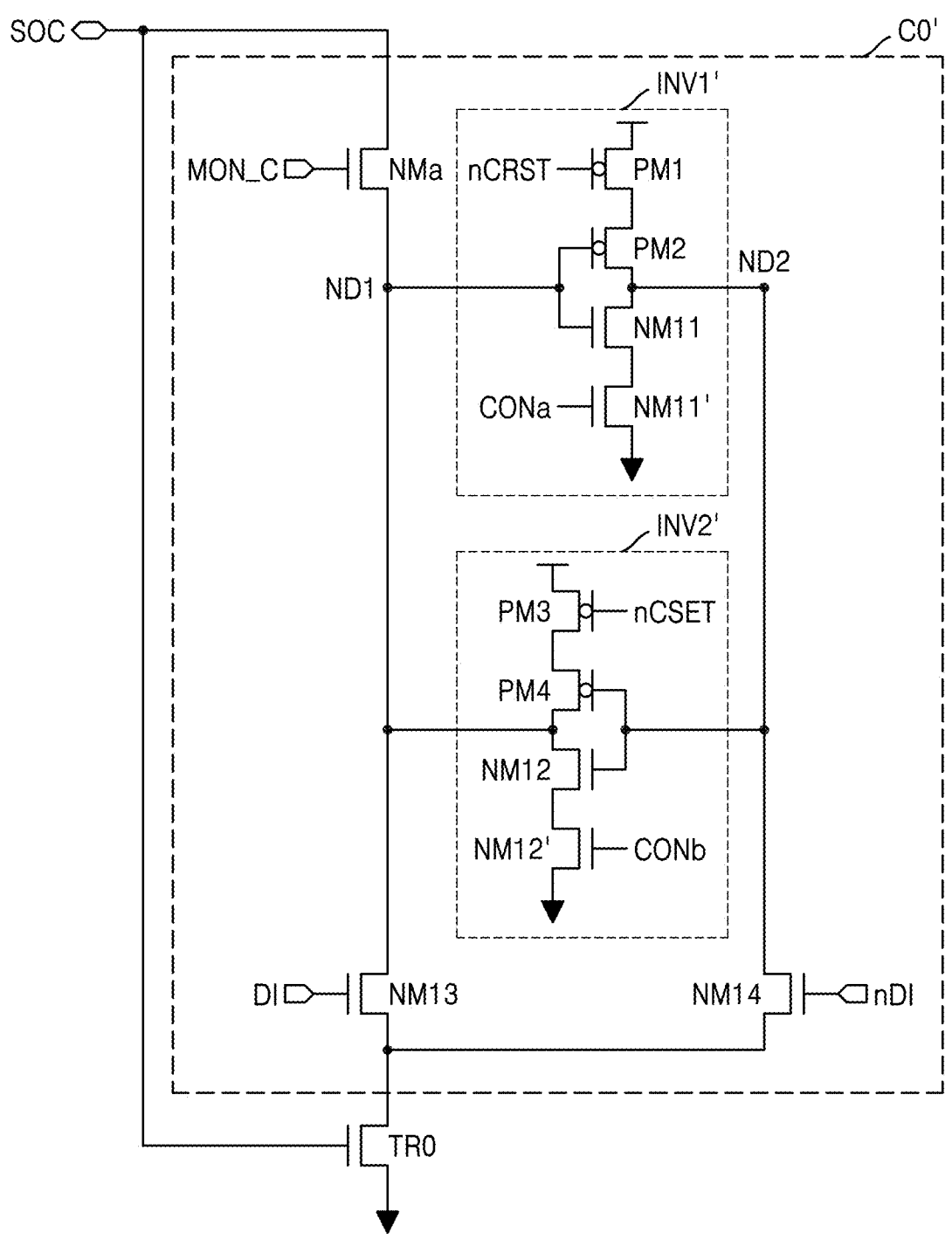
FIG. 11 is a circuit diagram of a first cache latch according to some implementations.

FIG. 11 is a circuit diagram of a first cache latch C0' according to some implementations. Referring to FIG. 11, the first cache latch C0' may correspond to a modified example of the first cache latch C0 of FIG. 10, and the description provided above with reference to FIG. 10 may also be applied to the illustrated implementations. The first cache latch C0' includes a first tri-state inverter INV1' and a second tri-state inverter INV2'. The first tri-state inverter INV1' may further include an NMOS transistor NM11' as compared to the first tri-state inverter INV1. NMOS transistors NM11 and NM11' may be connected in series to each other. The NMOS transistor NM11 may include a gate connected to a first node ND1 and a drain connected to the second node ND2. The NMOS transistor NM11' may include a gate configured to receive a control signal CONa and a source configured to receive a ground voltage. In this case, the control signal CONa may correspond to a turn-on voltage for turning on the NMOS transistor NM11'.

Similarly, the second tri-state inverter INV2' may further include an NMOS transistor NM12' as compared to the second tri-state inverter INV2. The NMOS transistors NM12 and NM12' may be connected in series to each other. The NMOS transistor NM12 may include a gate connected to the second node ND2 and a drain connected to the first node ND1. The NMOS transistor NM12' may include a gate configured to receive a control signal CONb and a source configured to receive a ground voltage. In this case, the control signal CONb may correspond to a turn-on voltage for turning on the NMOS transistor NM12'.

Figure 12:
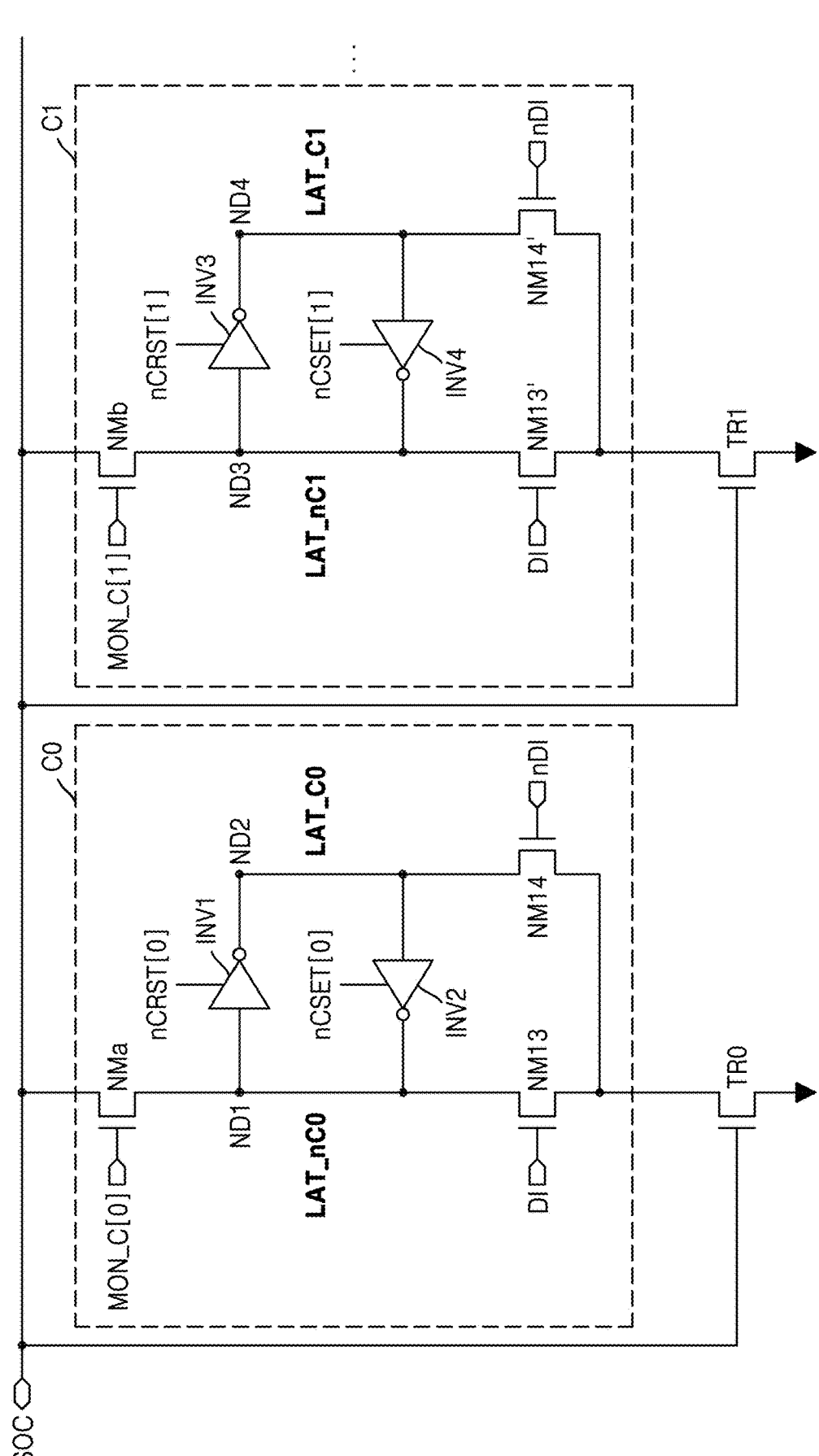
FIG. 12 is a circuit diagram of a plurality of cache latches according to some implementations.

FIG. 12 is a circuit diagram of a plurality of cache latches according to some implementations. Referring to FIG. 12, a first cache latch C0 may correspond to the first cache latch C0 of FIG. 10, and the descriptions provided above with reference to FIGS. 10 and 11 may also be applied to the illustrated implementations. The first cache latch C0 includes first and second tri-state inverters INV1 and INV2, which are cross-coupled between a first node ND1 and a second node ND2. The first tri-state inverter INV1 may be driven in response to a reset control signal nCRST[0], and the second tri-state inverter INV2 may be driven in response to a set control signal nCSET[0]. A first monitor transistor NMa may be driven in response to a cache monitoring signal MON_C[0] and control connection between a combined sensing node SOC and the first node ND1.

When the reset control signal nCRST[0] is at an enabled level, the first tri-state inverter INV1 may be enabled and output second node data LAT_C0 to the second node ND2 by inverting a voltage (i.e., first node data LAT_nC0) of the first node ND1. Moreover, when the reset control signal nCRST[0] is at a disabled level, the first tri-state inverter INV1 may be disabled, the second node data LAT_C0 may be maintained at the previous value without being affected by the first node data LAT_nC0, and a voltage of the second node ND2 may be maintained at the previous voltage level.

When the set control signal nCSET[0] is at an enabled level, the second tri-state inverter INV2 may be enabled and output the first node data LAT_nC0 to the first node ND1 by inverting the voltage (i.e., the second node data LAT_C0) of the second node ND2. When the set control signal nCSET[0] is at a disabled level, the second tri-state inverter INV2 may be disabled, the first node data LAT_nC0 may be maintained at the previous value without being affected by the second node data LAT_C0, and the voltage of the first node ND1 may be maintained at the previous voltage level.

A second cache latch C1 includes third and fourth tri-state inverters INV3 and INV4, which are cross-coupled to each other between a third node ND3 and a fourth node ND4. The third tri-state inverter INV3 may be driven in response to a reset control signal nCRST[1], and the fourth tri-state inverter INV4 may be driven in response to a set control signal nCSET[1]. A second monitor transistor NMb may be driven in response to a cache monitoring signal MON_C[1] and control connection between the combined sensing node SOC and the third node ND3. A set transistor NM13' may be driven in response to a set signal or a data signal DI, and a reset transistor NM14' may be driven in response to a reset signal or a data inverted signal nDI.

When the reset control signal nCRST[1] is at an enabled level, the third tri-state inverter INV3 may be enabled and output fourth node data LAT_C1 to the fourth node ND4 by inverting a voltage (i.e., third node data LAT_nC1) of the third node ND3. When the reset control signal nCRST[1] is at a disabled level, the third tri-state inverter INV3 may be disabled, the fourth node data LAT_C1 may be maintained at the previous value without being affected by the third node data LAT_nC1, and a voltage of the fourth node ND4 may be maintained at the previous voltage level.

When the set control signal nCSET[1] is at an enabled level, the fourth tri-state inverter INV4 may be enabled and output the third node data LAT_nC1 to the third node ND3 by inverting the voltage (i.e., the fourth node data LAT_C1) of the fourth node ND4. When the set control signal nCSET [1] is at a disabled level, the fourth tri-state inverter INV4 may be disabled, the third node data LAT_nC1 may be maintained at the previous value without being affected by the fourth node data LAT_C1, and the voltage of the third node ND3 may be maintained at the previous voltage level.

Conventionally, each cache latch may further include a dump transistor. For example, a dump transistor may be arranged between a first transistor TR0 and the set transistor NM13, and a dump transistor may be arranged between a second transistor TR1 and the set transistor NM13'. In this case, by turning on a dump transistor included in a selected cache latch and turning off a dump transistor included in an unselected cache latch, only the selected cache latch may be discharged, while the unselected cache latch may not be discharged. However, according to some implementations, each cache latch may not include a dump transistor, and by respectively controlling tri-state inverters (e.g., INV1 and INV2) included in the selected cache latch (e.g., C0) and tri-state inverters (e.g., INV3 and INV4) included in the unselected cache latch (e.g., C1), a data dumping operation on the selected cache latch may be supported. Therefore, according to some implementations, an embodied area of each cache latch may be reduced, and thus, an area of a page buffer circuit may be reduced.

Figure 13:
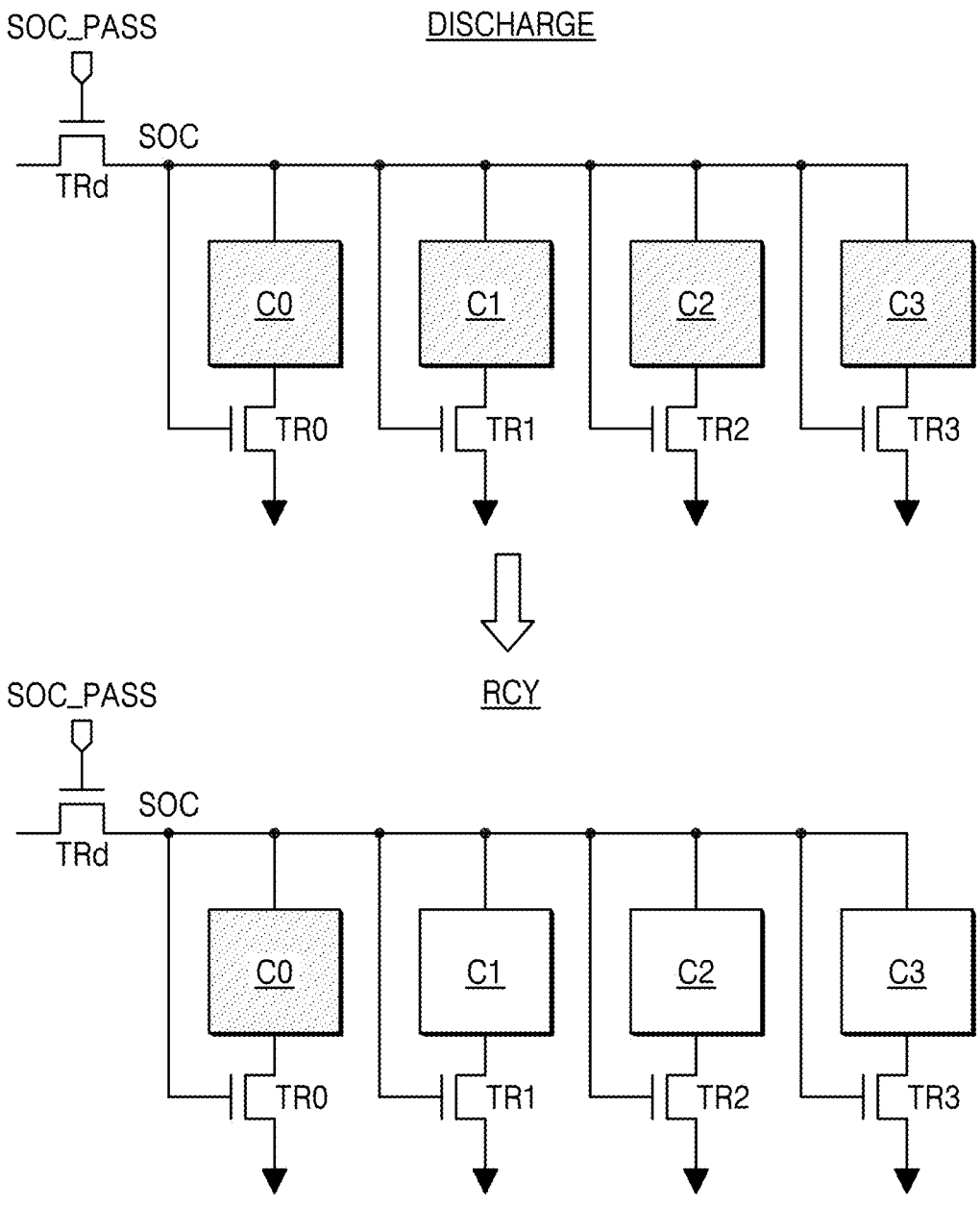
FIG. 13 illustrates a data dumping operation according to some implementations.

FIG. 13 illustrates a data dumping operation according to some implementations.

Referring to FIG. 13, the data dumping operation may include an operation of transmitting data from a selected page buffer unit or a selected main latch to a selected cache latch and may be, for example, performed in the data dumping section 72 of FIG. 7. For example, the selected cache latch may be a first cache latch C0, and unselected cache latches may be the remaining cache latches including second to fourth cache latches C1 to C3.

The data dumping operation may be performed during a time section including a first section and a second section. In the first section of the data dumping operation, a discharge operation may be performed on a plurality of cache latches including first to fourth cache latches C0 to C3 connected in common to a combined sensing node SOC. Accordingly, the first section may be referred to as "a discharge section DISCHARGE." In the first section, first to fourth transistors TR0 to TR3 may all be turned on according to a voltage level of the combined sensing node SOC, and thus, the plurality of cache latches may be discharged.

In the second section of the data dumping operation, that is, in the second section after the first section, a sensing operation may be performed on data transmitted from the selected first cache latch C0, and a recovery operation or restoration operation (i.e., a data recovery operation) may be performed on damaged data in unselected second to fourth cache latches C1 to C3. Accordingly, the second section may be referred to as a "recovery section RCY." In the second section, the operation of controlling the first cache latch C0 may be different from an operation of controlling the second to fourth cache latches C1 to C3 as described below in detail with reference to FIGS. 14A to 24B.

Figure 14A:
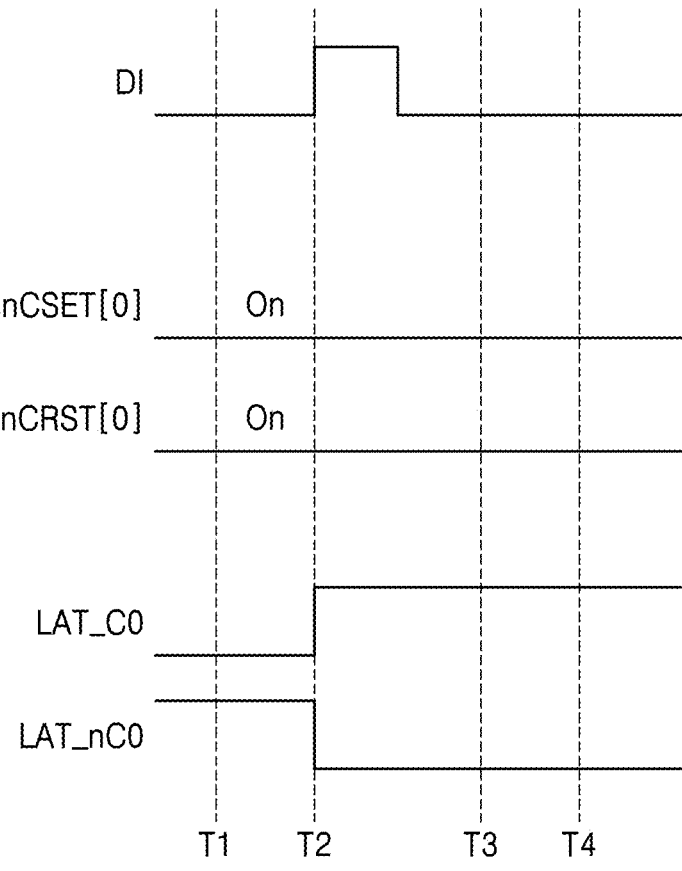
FIG. 14A is a timing diagram of a control operation on a selected cache latch in a data dumping operation according to some implementations.
Figure 14B:
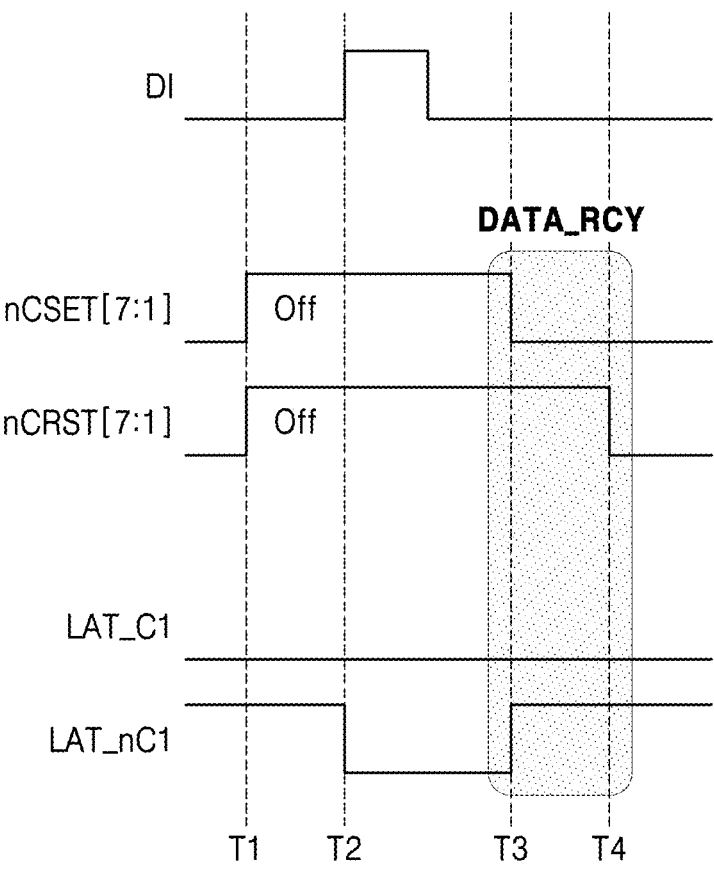
FIG. 14B is a timing diagram of a control operation on an unselected cache latch in a data dumping operation according to some implementations.

FIG. 14A is a timing diagram of a control operation on a selected cache latch in a data dumping operation according to some implementations. FIG. 14B is a timing diagram of a control operation on an unselected cache latch in a data dumping operation according to some implementations.

Referring to FIGS. 13, 14A, and 14B together, for example, in an eight-stage page buffer structure, eight cache latches may be connected in common to a combined sensing node SOC. When a data dumping operation is performed on a selected first cache latch C0, a control operation on tri-state inverters included in the selected first cache latch C0 may be different from a control operation on tri-state inverters included in each of unselected cache latches (e.g., second to eighth cache latches).

In the data dumping operation on the selected first cache latch C0, a set control signal nCSET[0] and a reset control signal nCRST[0], which are applied to the selected first cache latch C0, may be at an enabled level (e.g., a low level). Thus, first and second tri-state inverters INV1 and INV2 included in the first cache latch C0 may be enabled. Also, at a first time point T1, a set control signal nCSET[7:1] and a reset control signal nCRST[7:1], which are applied to the unselected cache latches, may transition from an enabled level to a disabled level (e.g., a high level). Thus, tri-state inverters included in each of the unselected cache latches (e.g., third and fourth tri-state inverters INV3, INV4 included in a second cache latch C1) may be disabled.

At a second time point T2, a set signal or a data signal DI may transition from a disabled level to an enabled level (e.g., a high level). Thus, a section in which the set signal or the data signal DI is maintained at an enabled level may be defined as a "discharge section," and the discharge section may correspond to the first section DISCHARGE of FIG. 13. During the discharge section or the first section, first to fourth cache latches C0 to C3 may be discharged. Hereinafter, a discharge operation on cache latches in the discharge section is described with reference to FIG. 15.

Figure 15:
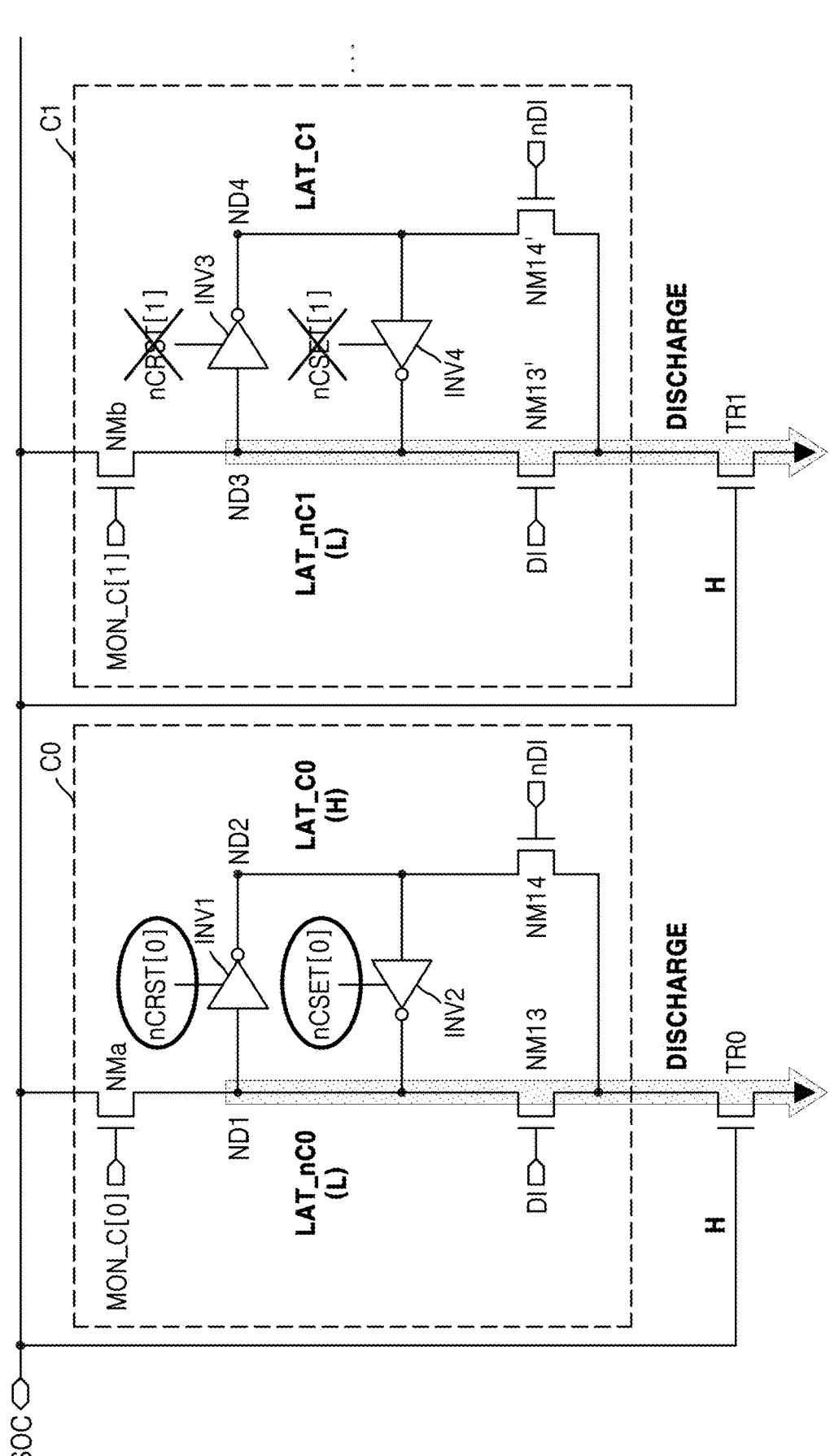
FIG. 15 illustrates a discharge operation according to some implementations.

FIG. 15 illustrates a discharge operation according to some implementations.

Referring to FIGS. 14A, 14B, and 15 together, at a second time point T2, when a set signal or a data signal DI reaches an enabled level, set transistors NM13 and NM13' may be turned on. When a voltage of a combined sensing node SOC is at a high level H, first and second transistors TR0 and TR1 may both be turned on. Thus, in a selected first cache latch C0, a discharge path may be generated through a first transistor TR0 and a set transistor NM13, and a voltage (i.e., first node data LAT_nC0) of a first node ND1 may reach a low level L. In this case, because a set control signal nCSET[0] and a reset control signal nCRST[0] are at an enabled level, first and second tri-state inverters INV1 and INV2 may be all enabled and each perform an inverting operation. Accordingly, second node data LAT_C0 may reach the high level H due to the inverting operation of the first tri-state inverter INV1, and the first node data LAT_nC0 may be maintained at the low level L due to the inverting operation of the second tri-state inverter INV2.

In addition, even in an unselected second cache latch C1, a discharge path may be generated through a second transistor TR1 and a set transistor NM13', and a voltage (i.e., third node data LAT_nC1) of a third node ND3 may reach the low level L. In this case, because a set control signal nCSET[1] and a reset control signal nCRST[1] are at a disabled level, both third and fourth tri-state inverters INV3 and INV4 may be disabled and may not perform inverting operations. Therefore, despite damage to the third node data LAT_nC1, fourth node data LAT_C1 may be maintained at the previous value, and a voltage of a fourth node ND4 may be maintained at, for example, the low level L.

At a third time point T3, a set control signal nCSET[7:1] applied to unselected cache latches may transition from a disabled level to an enabled level (e.g., a low level). Accordingly, a tri-state inverter included in each of the unselected cache latches (e.g., the fourth tri-state inverter INV4 included in the second cache latch C1) may be enabled. As a result, the fourth tri-state inverter INV4 may change or restore the third node data LAT_nC1 to a high level by inverting undamaged the fourth node data LAT_C1.

At a fourth time point T4, a reset control signal nCRST[7:1] applied to the unselected cache latches may transition from a disabled level to a enabled level (e.g., a low level). Accordingly, a tri-state inverter included in each of the unselected cache latches (e.g., the third tri-state inverter INV3 included in the second cache latch C1) may be enabled. As a result, the third tri-state inverter INV3 may invert the restored third node data LAT_nC1, and thus, the fourth node data LAT_C1 may be maintained at the previous value, and a voltage of the fourth node ND4 may be maintained at, for example, the low level L.

According to some implementations, after a discharge section of a data dumping operation, the set control signal nCSET[7:1] and the reset control signal nCRST[7:1], which are applied to the unselected cache latches, may sequentially transition to an enabled level. Thus, tri-state inverters included in the unselected cache latches may be sequentially enabled. For example, enabling the fourth tri-state inverter INV4 included in the second cache latch C1 may be followed by enabling the third tri-state inverter INV3. By sequentially enabling the fourth tri-state inverter INV4 and the third tri-state inverter INV3, data previously stored in the second cache latch C1 may be restored.

Because a data restoration operation is performed on the unselected cache latches after the third time point T3, a period after the third time point T3 may be defined as a "recovery section," and the recovery section may correspond to the second section RCY of FIG. 13. Because a sensing operation is performed on data transmitted to a selected first cache latch after the third time point T3, a period after the third time point T3 may be defined as a "sensing section," and the sensing section may correspond to the second section RCY of FIG. 13. Thus, the recovery section and sensing section may correspond to the same time section (e.g., data recovery section DATA_RCY).

Figure 16:
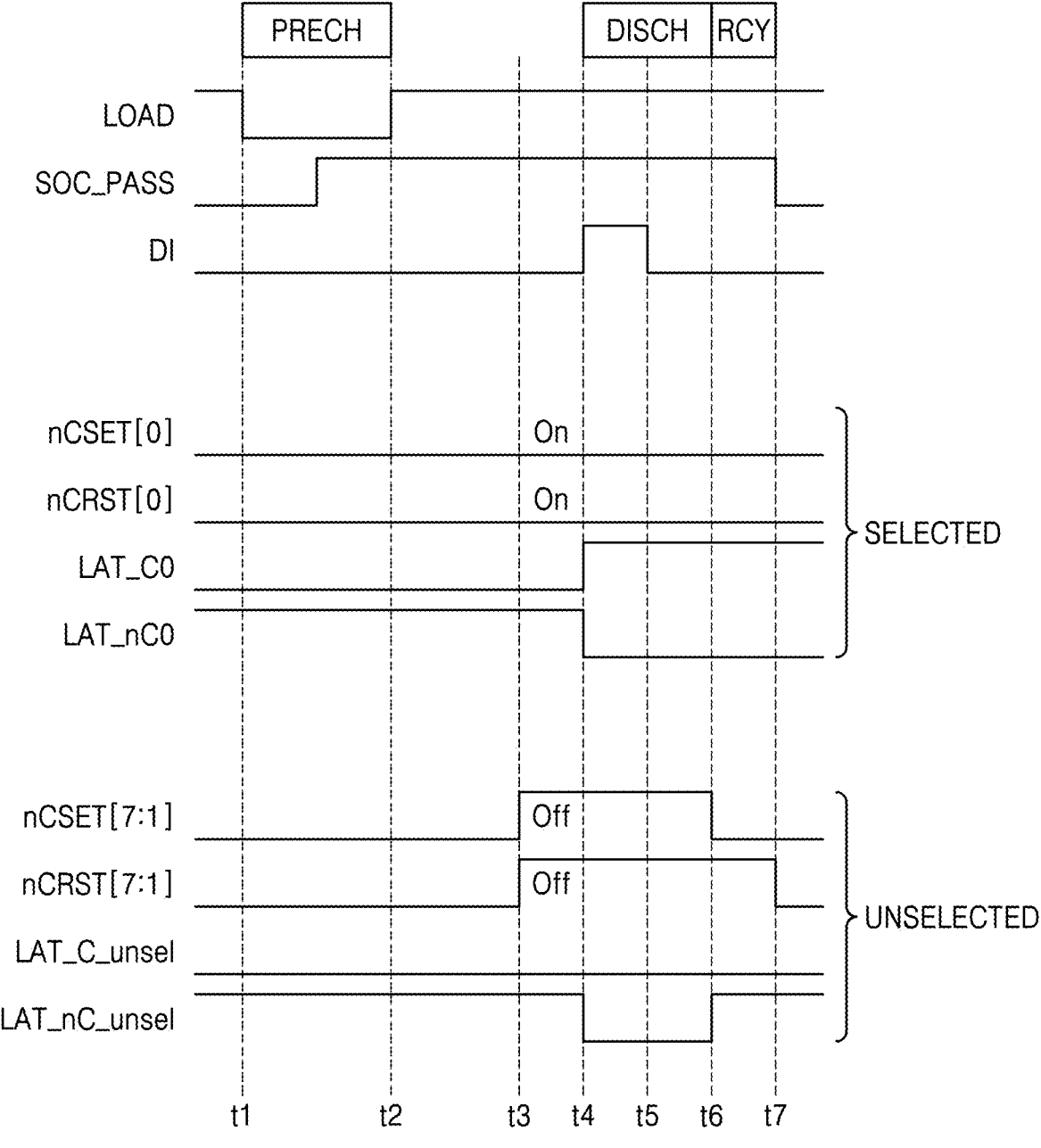
FIG. 16 is a detailed timing diagram of the data dumping operation of FIGS. 14A and 14B, according to some implementations.

FIG. 16 is a detailed timing diagram of the data dumping operation of FIGS. 14A and 14B, according to some implementations.

Referring to FIGS. 8, 15, and 16 together, for example, in an eight-stage page buffer structure, eight cache latches may be connected in common to a combined sensing node SOC. A data dumping operation may be performed during a time section including a precharge section PRECH, a discharge section DISCH, and a recovery section RCY. The precharge section PRECH may correspond to a time section from a first time point t1 to a second time point t2, the discharge section DISCH may correspond to a time section from a fourth time point t4 to a sixth time point t6, and the recovery section RCY may correspond to a time section after the sixth time point t6. For example, the discharge section DISCH may correspond to the first section DISCHARGE of FIG. 13, and the recovery section RCY may correspond to the second section RCY of FIG. 13. Hereinafter, control signals applied to a page buffer circuit in the data dumping operation are described in detail.

At the first time point t1, a load signal LOAD may transition to a low level, which is an enabled level. At the second time point t2, the load signal LOAD may transition to a high level, which is a disabled level. The load signal LOAD may be maintained at the enabled level during the precharge section PRECH. Accordingly, precharge transistors PMa to PMd may be turned on, and thus, first to eighth sensing nodes SO0 to SO7 and the combined sensing node SOC may be precharged. A pass control signal SOC_PASS may transition to a high level, which is an enabled level, during the precharge section PRECH and transition to a low level, which is a disabled level, at a seventh time point t7. While the pass control signal SOC_PASS is maintained at the enabled level, a pass transistor TRd may be turned on, and thus, the combined sensing node SOC may be connected to the first to eighth sensing nodes SO0 to SO7.

At a third time point t3, a set control signal nCSET[7:1] and a reset control signal nCRST[7:1], which are applied to unselected cache latches, may transition to a high level, which is a disabled level. As a result, tri-state inverters included in the unselected cache latches (e.g., third and fourth tri-state inverters INV3 and INV4 included in a second cache latch C1) may be disabled. At the fourth time point t4, a set signal or a data signal DI may transition to a high level that is an enabled level. At a fifth time point t5, the set signal or the data signal DI may transition to a low level, which is a disabled level.

When the data signal DI transitions to the enabled level, a discharge operation may be performed in cache latches CL0 to CL7 connected to the combined sensing node SOC. In this case, first node data LAT_nC0 of a first cache latch CL0 may reach a low level, and second node data LAT_C0 may reach a high level due to an inverting operation of an enabled first tri-state inverter INV1. Moreover, third node data LAT_nC_unsel of the unselected cache latches (e.g., the third node data LAT_nC1 of the second cache latch C1) may reach a low level, but tri-state inverters included in the unselected cache latches may remain disabled. Thus, fourth node data LAT_C_unsel of the unselected cache latches (e.g., the fourth node data LAT_C1 of the second cache latch C1) may not be damaged but may be maintained at a low level.

At the sixth time point t6, the set control signal nCSET [7:1] applied to the unselected cache latches may transition to an enabled level. For example, the fourth tri-state inverter INV4 included in the second cache latch CL1 may be enabled, and the enabled fourth tri-state inverter INV4 may restore the third node data LAT_nC1 to a high level by inverting the fourth node data LAT_C1. At the seventh time point t7, the reset control signal nCRST[7:1] applied to the unselected cache latches may transition to an enabled level. For example, the third tri-state inverter INV3 included in the second cache latch CL1 may be enabled, and the enabled third tri-state inverter INV3 may maintain the fourth node data LAT_C1 at a low level by inverting the third node data LAT_nC1.

According to some implementations, the set control signal nCSET[7:1] and the reset control signal nCRST[7:1], which are applied to the unselected cache latches, may sequentially transition to an enabled level, and the tri-state inverters included in the unselected cache latches may be sequentially enabled. As a result, data damaged by discharging the unselected cache latches may be restored to data previously stored in each of the unselected cache latches.

Figure 17A:
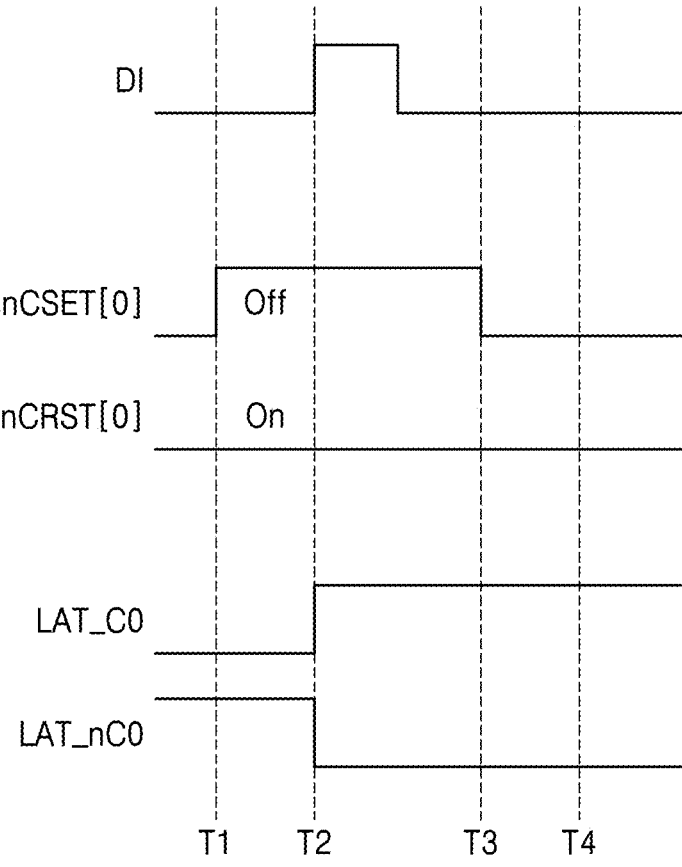
FIG. 17A is a timing diagram of a control operation on a selected cache latch in a data dumping operation according to some implementations.
Figure 17B:
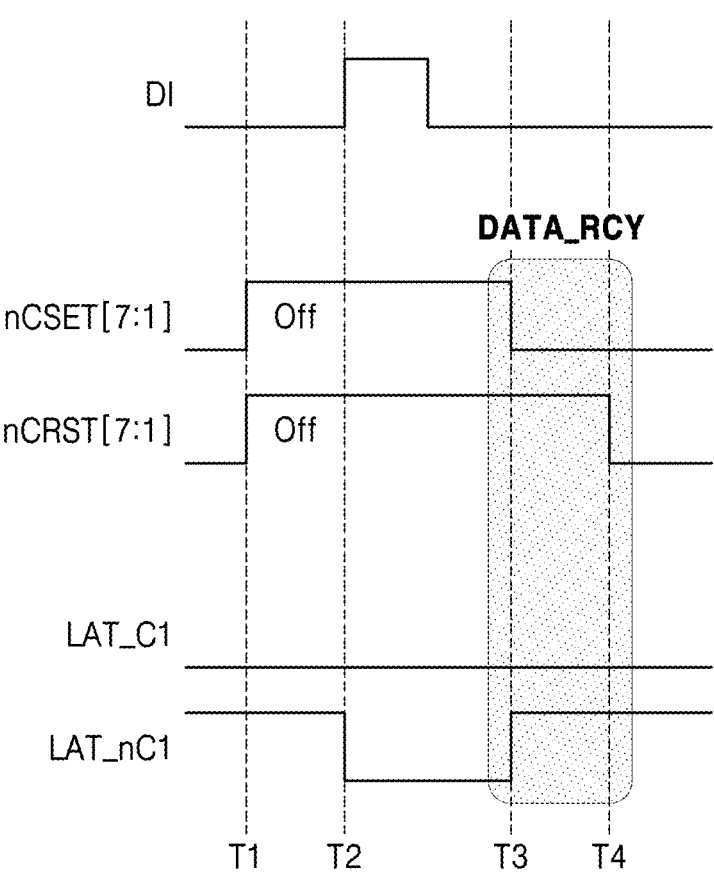
FIG. 17B is a timing diagram of a control operation on an unselected cache latch in a data dumping operation according to some implementations.

FIG. 17A is a timing diagram of a control operation on a selected cache latch in a data dumping operation according to some implementations. FIG. 17B is a timing diagram of a control operation on an unselected cache latch in a data dumping operation according to some implementations. Referring to FIGS. 13, 17A, and 17B together, some implementations may correspond to a modified example of FIGS. 14A and 14B, and the descriptions provided above with reference to FIGS. 14A to 16 may also be applied to the illustrated implementations. Because the illustrated implementations are different from the implementations shown in FIG. 14A in a control operation on a selected cache latch, the description below will focus on the control operation on the selected cache latch.

In a data dumping operation on a selected first cache latch C0, a reset control signal nCRST[0] may be at a low level, which is an enabled level, and a first tri-state inverter INV1 included in the first cache latch C0 may be enabled. At a first time point T1, a set control signal nCSET[0] may transition to a high level, which is a disabled level, and a second tri-state inverter INV2 may be disabled. Accordingly, power consumption of the first cache latch C0 may be reduced in the data dumping operation. At a second time point T2, when a set signal or a data signal DI reaches an enabled level, a set transistor NM13 may be turned on, and first node data LAT_nC0 may reach a low level L. In this case, because the reset control signal nCRST[0] is at the enabled level, the first tri-state inverter INV1 may be enabled and perform an inverting operation. By the inverting operation of the enabled first tri-state inverter INV1, second node data LAT_C0 may reach a high level H.

At the first time point T1, a set control signal nCSET[7:1] and a reset control signal nCRST[7:1] may transition to a high level. At the second time point T2, when the set signal or the data signal DI reaches the enabled level, a set transistor NM13' may be turned on, and third node data LAT_nC1 may reach the low level L. At a third time point T3, when the set control signal nCSET[7:1] transitions to a low level, a fourth tri-state inverter INV4 may be enabled. Accordingly, the fourth tri-state inverter INV4 may invert undamaged fourth node data LAT_C1, and thus, the third node data LAT_nC1 may be restored to a high level. At a fourth time point T4, the reset control signal nCRST[7:1] may transition to a low level, and a third tri-state inverter INV3 may be enabled. As a result, the third tri-state inverter INV3 may invert the restored third node data LAT_nC1, and the fourth node data LAT_C1 may be maintained at a low level.

Figure 18:
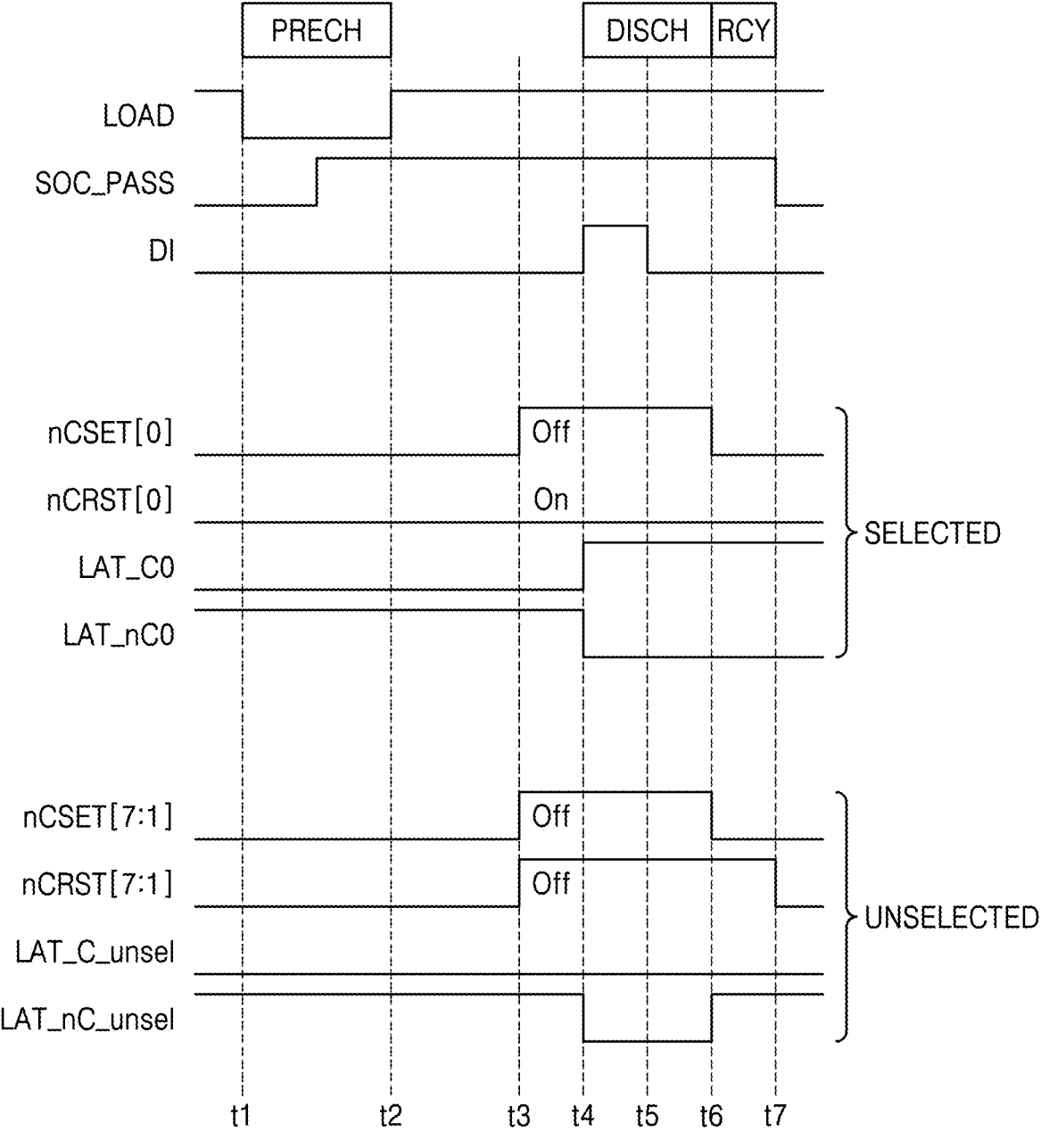
FIG. 18 is a detailed timing diagram of the data dumping operation of FIGS. 17A and 17B, according to some implementations.

FIG. 18 is a detailed timing diagram of the data dumping operation of FIGS. 17A and 17B, according to some implementations. Referring to FIGS. 8, 15, and 18 together, some implementations may correspond to a modified example of FIG. 16, and the description provided above with reference to FIG. 16 may also be applied to the illustrated implementations. The description below will focus on differences between the illustrated implementations and the implementations shown in FIG. 16.

In a data dumping operation on a selected first cache latch C0, a reset control signal nCRST[0] may be maintained at a low level, and thus, a first tri-state inverter INV1 may be enabled. By the inverting operation of the enabled first tri-state inverter INV1, second node data LAT_C0 may transition to a high level. At a third time point t3, a set control signal nCSET[0] may transition to a high level, and thus, a second tri-state inverter INV2 may be disabled. As a result, power consumption of the first cache latch C0 may be reduced. At a sixth time point t6, the set control signal nCSET[0] may transition to a low level, and thus, the second tri-state inverter INV2 may be enabled. By the inverting operation of the enabled second tri-state inverter INV2, first node data LAT_nC0 may be maintained at a low level.

Figure 19A:
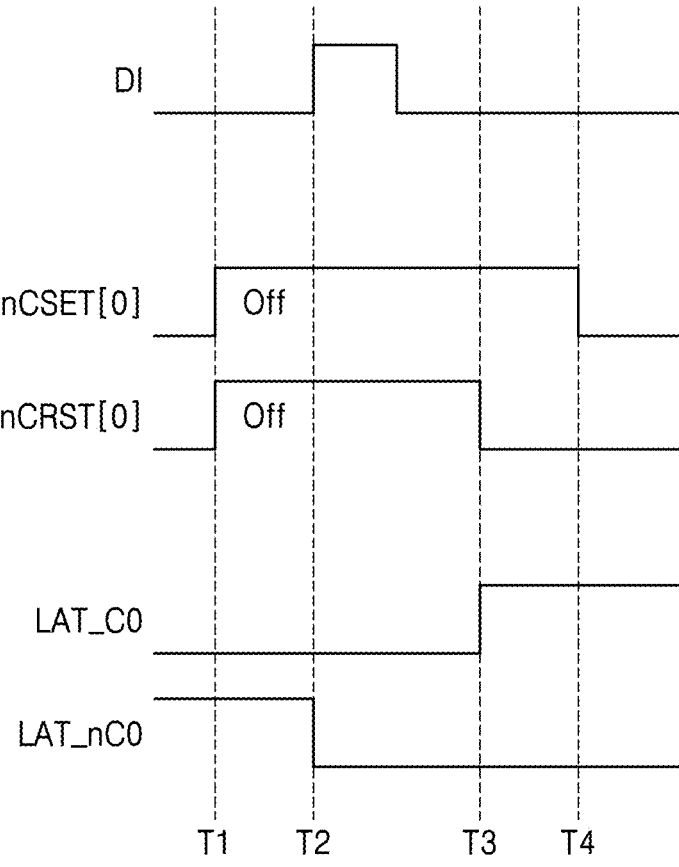
FIG. 19A is a timing diagram of a control operation on a selected cache latch in a data dumping operation according to some implementations.
Figure 19B:
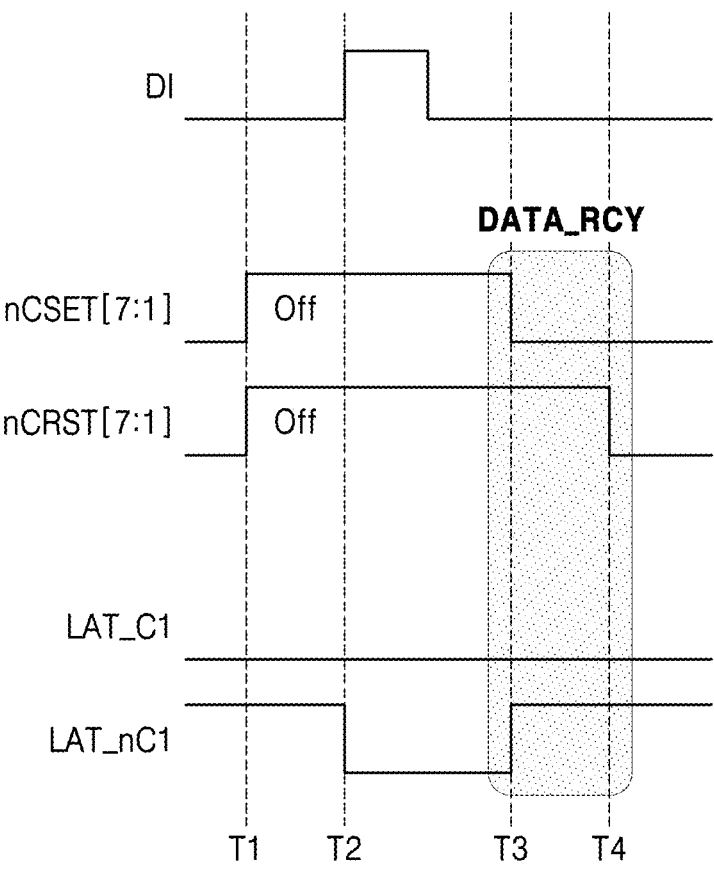
FIG. 19B is a timing diagram of a control operation on an unselected cache latch in a data dumping operation according to some implementations.

FIG. 19A is a timing diagram of a control operation on a selected cache latch in a data dumping operation according to some implementations. FIG. 19B is a timing diagram of a control operation on an unselected cache latch in a data dumping operation according to some implementations. Referring to FIGS. 13, 19A, and 19B together, some implementations may correspond to a modified example of FIGS. 14A and 14B, and the descriptions provided above with reference to FIGS. 14A to 16 may also be applied to the illustrated implementations. Because the illustrated implementations are different from the implementations shown in FIG. 14A in a control operation on a selected cache latch, the description below will focus on the control operation on the selected cache latch.

In a data dumping operation on a selected first cache latch C0, at a first time point T1, a set control signal nCSET[0] and a reset control signal nCRST[0] may transition to a high level, which is a disabled level, and thus, first and second tri-state inverters IVN1 and INV2 may be disabled. At a second time point T2, when a set signal or a data signal DI reaches an enabled level, a set transistor NM13 may be turned on, and first node data LAT_nC0 may reach a low level. In this case, because the set control signal nCSET[0] and the reset control signal nCRST[0] are at a disabled level, both the first and second tri-state inverters INV1 and INV2 may be disabled and may not perform inverting operations. Accordingly, second node data LAT_C0 may be maintained at the previous level (e.g., a low level).

At a third time point T3, when the reset control signal nCRST[0] transitions to a low level, which is an enabled level, the first tri-state inverter INV1 may be enabled. The enabled first tri-state inverter INV1 may invert the first node data LAT_nC0, and thus, the second node data LAT_C0 may transition to a high level. At a fourth time point T4, the set control signal nCSET[0] may transition to a low level, which is an enabled level, and thus, the second tri-state inverter INV2 included in the first cache latch C0 may be enabled. The second tri-state inverter INV2 may invert the second node data LAT_C0, and thus, the first node data LAT_nC0 may be maintained at a low level.

According to some implementations, in a discharge section, the reset control signal nCRST[0] and the set control signal nCSET[0] may transition to a disabled level. After the discharge section, the reset control signal nCRST[0] and the set control signal nCSET[0] may be sequentially transition to a enabled level. Thus, the first and second tri-state inverters INV1 and INV2 may be sequentially enabled. For example, enabling the first tri-state inverter INV1 may be followed by enabling the second tri-state inverter INV2. By sequentially enabling the first tri-state inverter INV1 and the second tri-state inverter INV2, the first cache latch C0 may store data received from a main latch. In this case, because the first and second tri-state inverters INV1 and INV2 are disabled in the discharge section, power consumption of the first cache latch C0 may be reduced in a data dumping operation.

Moreover, at the first time point T1, a set control signal nCSET[7:1] and the reset control signal nCRST[7:1] may transition to a high level. At the second time point T2, when the set signal or the data signal DI reaches an enabled level, a set transistor NM13' may be turned on, and third node data LAT_nC1 may reach a low level L. At the third time point T3, the set control signal nCSET[7:1] may transition to a low level, and a fourth tri-state inverter INV4 may be enabled. As a result, the fourth tri-state inverter INV4 may restore third node data LAT_nC1 to a high level by inverting undamaged fourth node data LAT_C1. At the fourth time point T4, the reset control signal nCRST[7:1] may transition to a low level, and a third tri-state inverter INV3 may be enabled. Accordingly, the third tri-state inverter INV3 may invert the restored third node data LAT_nC1, and the fourth node data LAT_C1 may be maintained at a low level.

Figure 20:
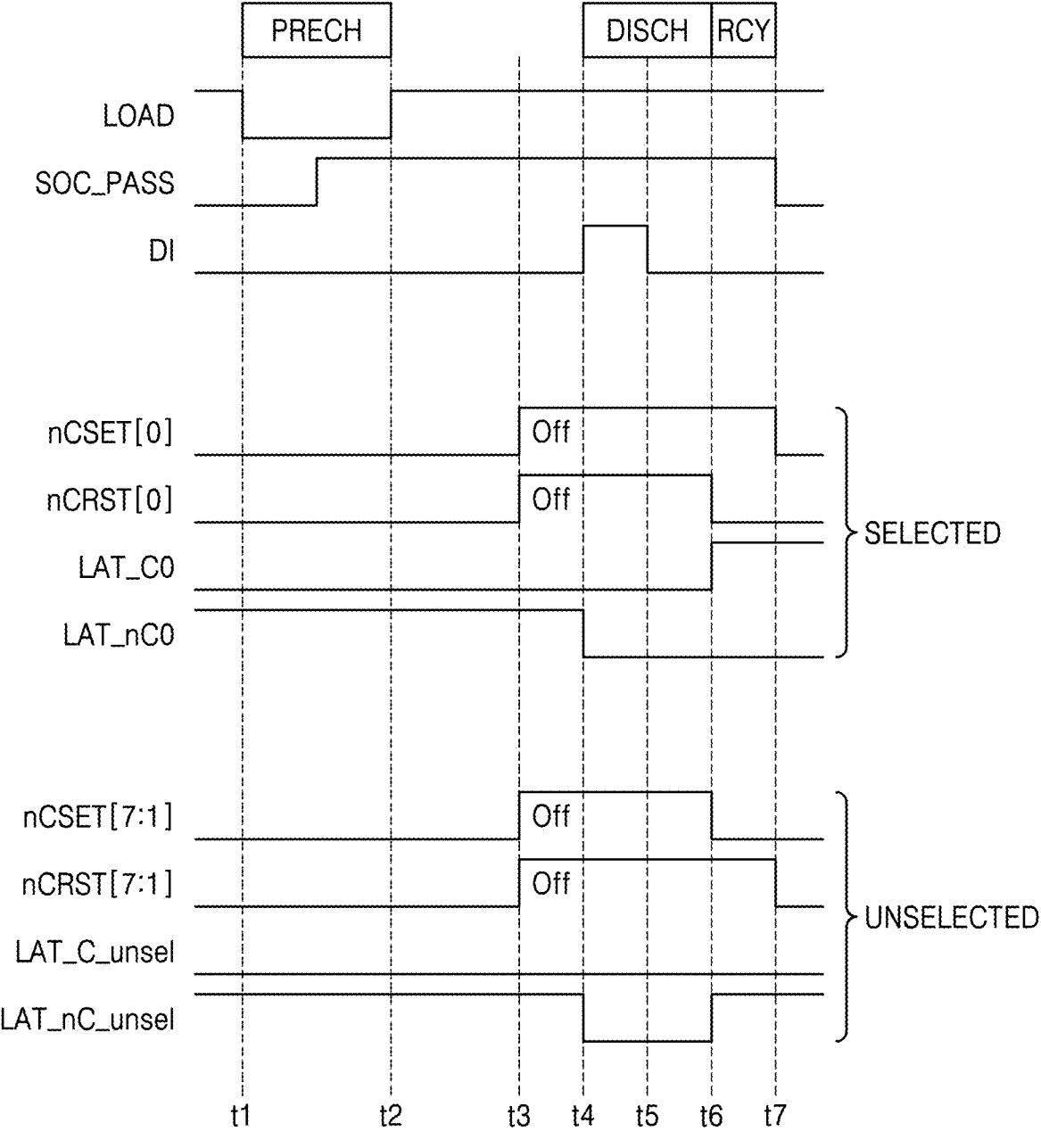
FIG. 20 is a detailed timing diagram of the data dumping operation of FIGS. 19A and 19B, according to some implementations.

FIG. 20 is a detailed timing diagram of the data dumping operation of FIGS. 19A and 19B, according to some implementations. Referring to FIGS. 8, 15, and 20 together, some implementations may correspond to a modified example of FIG. 16, and the description provided above with reference to FIG. 16 may also be applied to the illustrated implementations. The description below will focus on differences between the illustrated implementations and the implementations shown in FIG. 16.

In a data dumping operation on a selected first cache latch C0, at a third time point t3, a set control signal nCSET[0] and a reset control signal nCRST[0] may transition to a high level. Thus, first and second tri-state inverters INV1 and INV2 may be disabled, thereby reducing power consumption of the first cache latch C0. At a sixth time point t6, the reset control signal nCRST[0] may transition to a low level, and thus, the first tri-state inverter INV1 may be enabled. By the inverting operation of the enabled first tri-state inverter INV1, second node data LAT_C0 may transition to a high level. At a seventh time point t7, the set control signal nCSET[0] may transition to a low level, and thus, the second tri-state inverter INV2 may be enabled. By the inverting operation of the enabled second tri-state inverter INV2, first node data LAT_nC0 may be maintained at a low level.

Figure 21A:
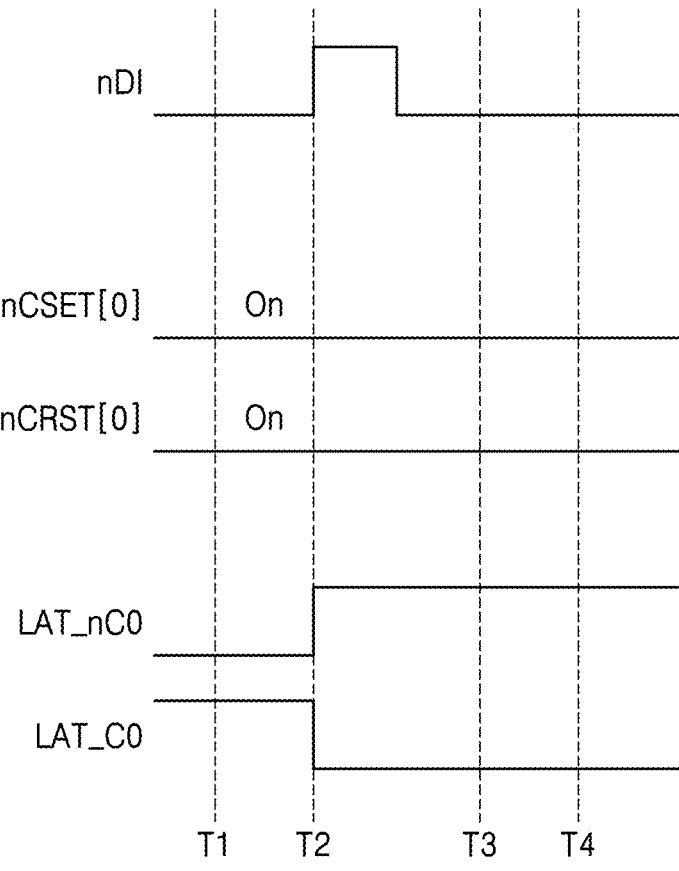
FIG. 21A is a timing diagram of a control operation on a selected cache latch in a data dumping operation according to some implementations.
Figure 21B:
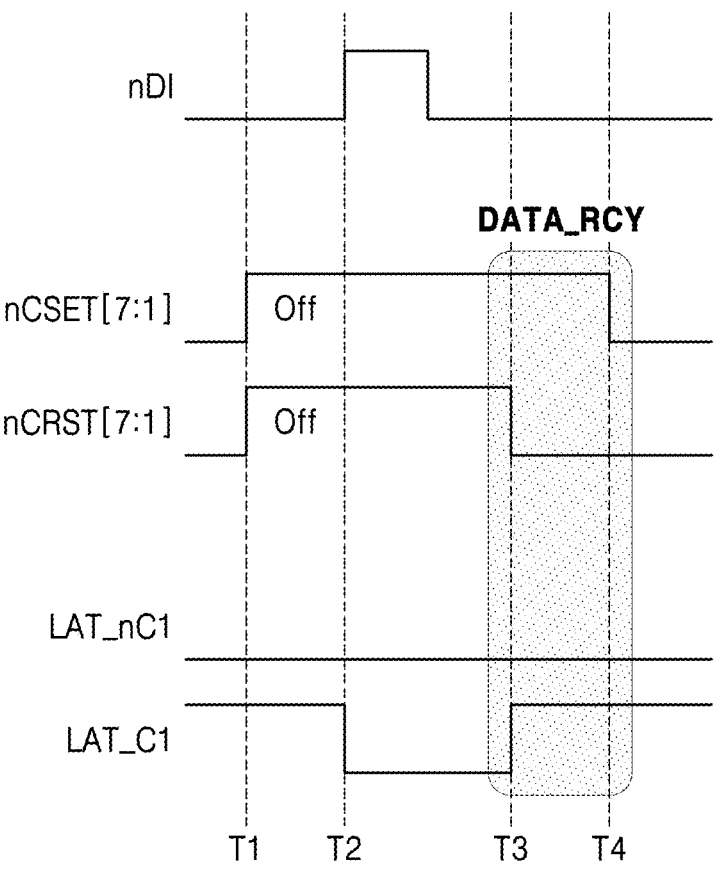
FIG. 21B is a timing diagram of a control operation on an unselected cache latch in a data dumping operation according to some implementations.
Figure 22:
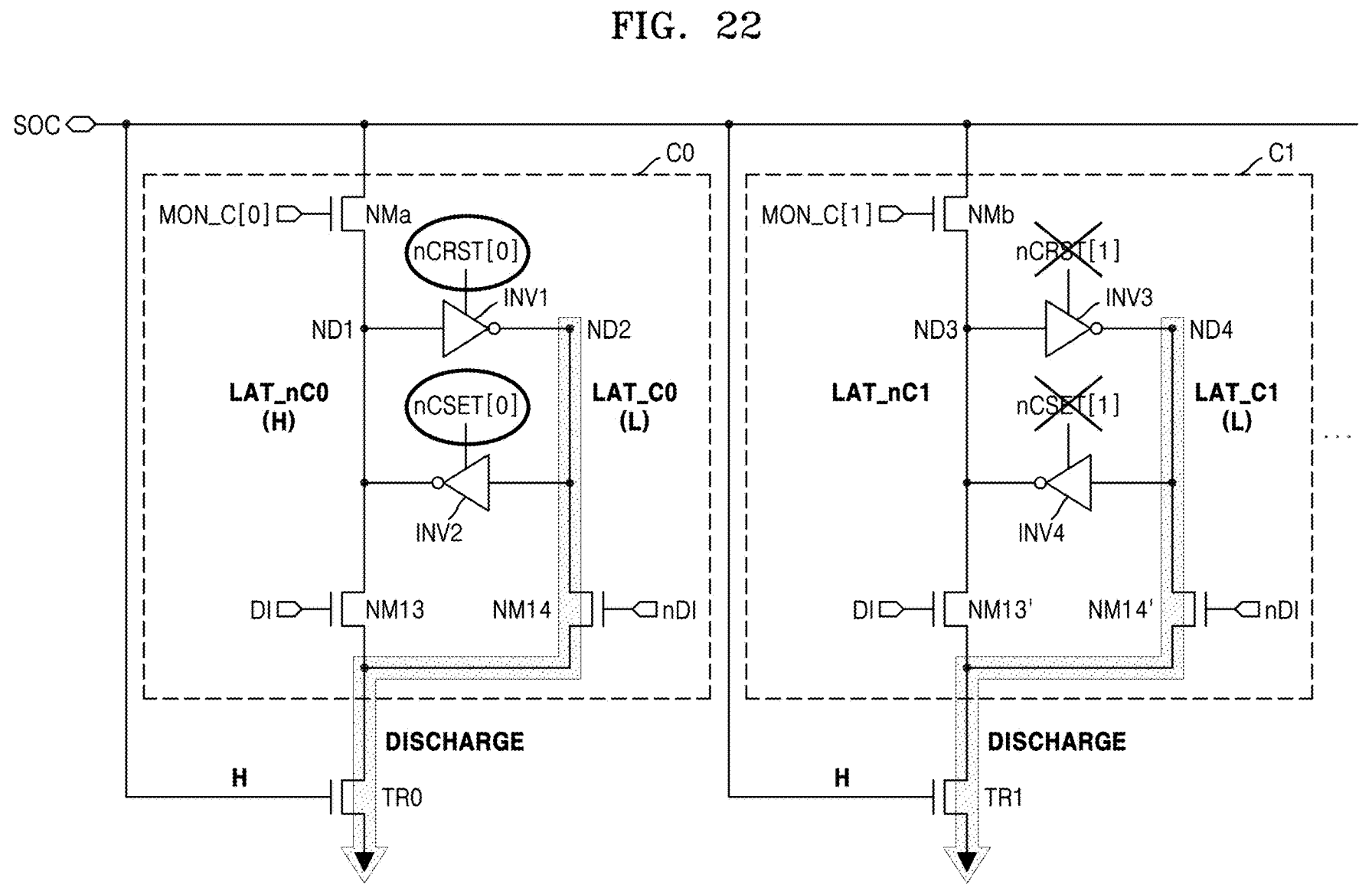

FIG. 21A is a timing diagram of a control operation on a selected cache latch in a data dumping operation according to some implementations. FIG. 21B is a timing diagram of a control operation on an unselected cache latch in a data dumping operation according to some implementations. FIG. 22 illustrates a discharge operation according to some implementations.

Referring to FIGS. 21A to 22 together, some implementations may correspond to a modified example of FIGS. 14A and 14B, and the descriptions provided above with reference to FIGS. 14A to 16 may also be applied to the illustrated implementations. In the implementations shown in FIGS. 14A to 16, a discharge path for a first node ND1 may be generated by controlling a set signal or a data signal DI, whereas in the illustrated implementations, a discharge path for a second node ND2 may be generated by controlling a reset signal or a data inverted signal nDI.

In a data dumping operation on a selected first cache latch C0, a set control signal nCSET[0] and a reset control signal nCRST[0], which are applied to the selected first cache latch C0, may be at a low level, which is an enabled level. Thus, first and second tri-state inverters INV1 and INV2 included in the first cache latch C0 may be enabled. Also, at a first time point T1, a set control signal nCSET[7:1] and a reset control signal nCRST[7:1], which are applied to unselected cache latches, may transition to a high level. Thus, tri-state inverters included in each of the unselected cache latches (e.g., third and fourth tri-state inverters INV3 and INV4 included in the second cache latch C1) may be disabled.

At a second time point T2, the reset signal or the data inverted signal nDI may transition to a high level, which is an enabled level. As described above, a section in which the reset signal or the data inverted signal nDI is maintained at an enabled level may be defined as a "discharge section," and the discharge section may correspond to the first section DISCHARGE of FIG. 13. During the discharge section or the first section, a discharge operation may be performed on the selected first cache latch C0.

At the second time point T2, when the reset signal or the data inverted signal nDI reaches an enabled level, reset transistors NM14 and NM14' may be turned on. When a voltage of a combined sensing node SOC is at a high level H, both first and second transistors TR0 and TR1 may be turned on. Therefore, in the selected first cache latch C0, a discharge path may be generated through the first transistor TR0 and the reset transistor NM14, and a voltage (i.e., second node data LAT_C0) of the second node ND2 may reach a low level L. In this case, because the set control signal nCSET[0] and the reset control signal nCRST[0] are at an enabled level, the first and second tri-state inverters INV1 and INV2 may be all enabled and each perform an inverting operation. First node data LAT_nC0 may reach the high level H due to the inverting operation of the second tri-state inverter INV2, and the second node data LAT_C0 may be maintained at the low level L due to the inverting operation of the first tri-state inverter INV1.

In the unselected second cache latch C1, a discharge path may be generated through the second transistor TR1 and the reset transistor NM14', and a voltage (i.e., fourth node data LAT_C1) of a fourth node ND4 may reach the low level L. In this case, because the set control signal nCSET[1] and the reset control signal nCRST[1] are at a disabled level, both the third and fourth tri-state inverters INV3 and INV4 may be disabled and may not perform inverting operations. Therefore, despite damage to the fourth node data LAT_C1, third node data LAT_nC1 may be maintained at the previous level (e.g., a low level).

At a third time point T3, the reset control signal nCRST [7:1] applied to the unselected cache latches may transition to a low level, a tri-state inverter included in each of the unselected cache latches (e.g., the third tri-state inverter INV3 included in the second cache latch C1) may be enabled. The enabled third tri-state inverter INV3 may restore the fourth node data LAT_C1 to a high level by inverting undamaged the third node data LAT_nC1.

At a fourth time point T4, a set control signal nCSET[7:1] applied to the unselected cache latches may transition to a low level, and a tri-state inverter included in each of the unselected cache latches (e.g., the fourth tri-state inverter INV4 included in the second cache latch C1) may be enabled. The enabled fourth tri-state inverter INV4 may invert the restored fourth node data LAT_C1, and thus, the third node data LAT_nC1 may be maintained at the previous level (e.g., a low level).

According to some implementations, after the discharge section of the data dumping operation, the set control signal nCSET[7:1] and the reset control signal nCRST[7:1], which are applied to the unselected cache latches, may sequentially transition to an enabled level. Thus, the tri-state inverters included in the unselected cache latches may be sequentially enabled. For example, enabling the third tri-state inverter INV3 included in the second cache latch C1 may be followed by enabling the fourth tri-state inverter INV4. By sequentially enabling the third tri-state inverter INV3 and the fourth tri-state inverter INV4, data previously stored in the second cache latch C1 may be restored.

Figure 23A:
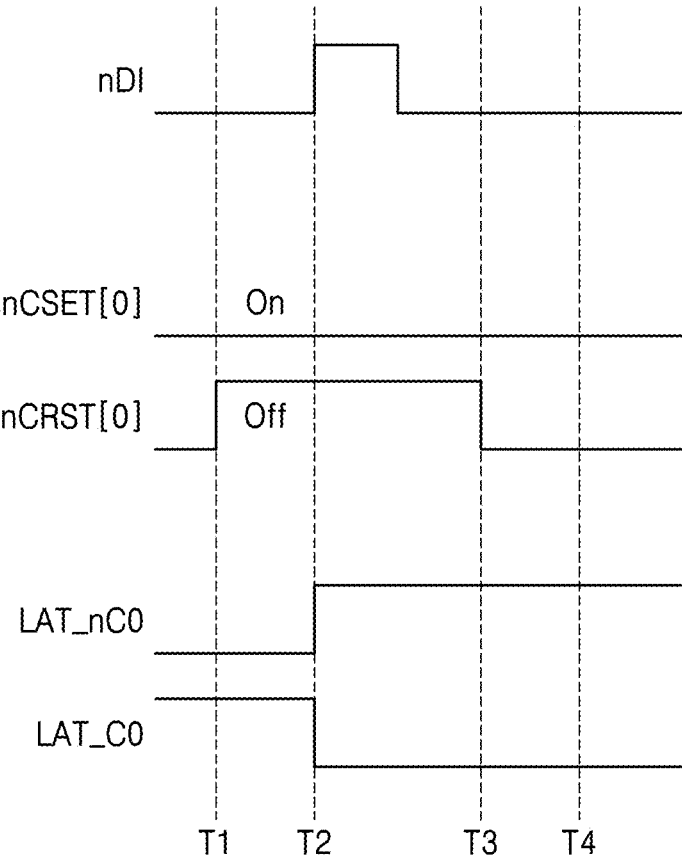
FIG. 23A is a timing diagram of a control operation on a selected cache latch in a data dumping operation according to some implementations.
Figure 23B:
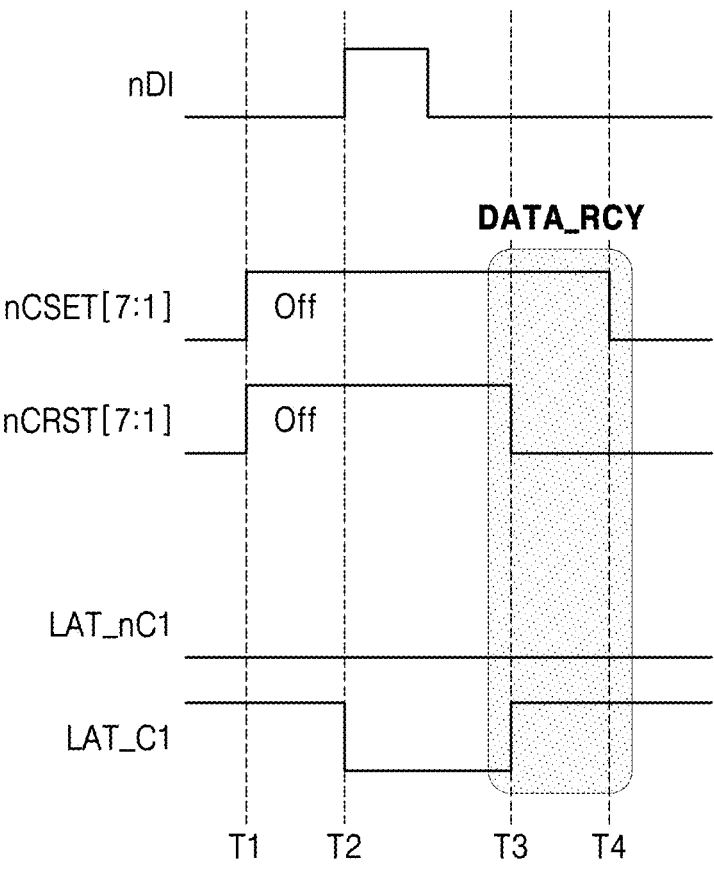
FIG. 23B is a timing diagram of a control operation on an unselected cache latch in a data dumping operation according to some implementations.

FIG. 23A is a timing diagram of a control operation on a selected cache latch in a data dumping operation according to some implementations. FIG. 23B is a timing diagram of a control operation on an unselected cache latch in a data dumping operation according to some implementations. Referring to FIGS. 22 to 23B together, some implementations may correspond to a modified example of FIGS. 17A and 17B, and the descriptions provided above with reference to FIGS. 17A to 18 may also be applied to the illustrated implementations. Also, some implementations may correspond to a modified example of FIGS. 21A and 21B, and the descriptions provided above with reference to FIGS. 21A to 22 may also be applied to the illustrated implementations.

In a data dumping operation on a selected first cache latch C0, a set control signal nCSET[0] may be at a low level, and a second tri-state inverter INV2 may be enabled. At a first time point T1, a reset control signal nCRST[0] may transition to a high level, and a first tri-state inverter INV1 may be disabled. At a second time point T2, when a reset signal or a data inverted signal nDI reaches an enabled level, a reset transistor NM14 may be turned on, and second node data LAT_C0 may reach a low level L. In this case, because the set control signal nCSET[0] is at an enabled level, the second tri-state inverter INV2 may be enabled and perform an inverting operation. By the inverting operation of the enabled second tri-state inverter INV2, first node data LAT_nC0 may reach a high level H. At a third time point T3, when the reset control signal nCRST[0] transitions to a low level, the first tri-state inverter INV1 may be enabled. The enabled first tri-state inverter INV1 may invert the first node data LAT_nC0, and thus, the second node data LAT_C0 may be maintained at the low level L.

At the first time point T1, a set control signal nCSET[7:1] and a reset control signal nCRST[7:1] may transition to a high level. At the second time point T2, when the reset signal or the data inverted signal nDI reaches an enabled level, a reset transistor NM14' may be turned on, and fourth node data LAT_C1 may reach the low level L. At the third time point T3, when the reset control signal nCRST[7:1] transitions to a low level, a third tri-state inverter INV3 may be enabled. The enabled third tri-state inverter INV3 may invert undamaged third node data LAT_nC1, and thus, the fourth node data LAT_C1 may be restored to a high level. At a fourth time point T4, the set control signal nCSET[7:1] may transition to a low level, and a fourth tri-state inverter INV4 may be enabled. The enabled fourth tri-state inverter INV4 may invert the restored fourth node data LAT_C1, and the third node data LAT_nC1 may be maintained at a low level.

Figure 24A:
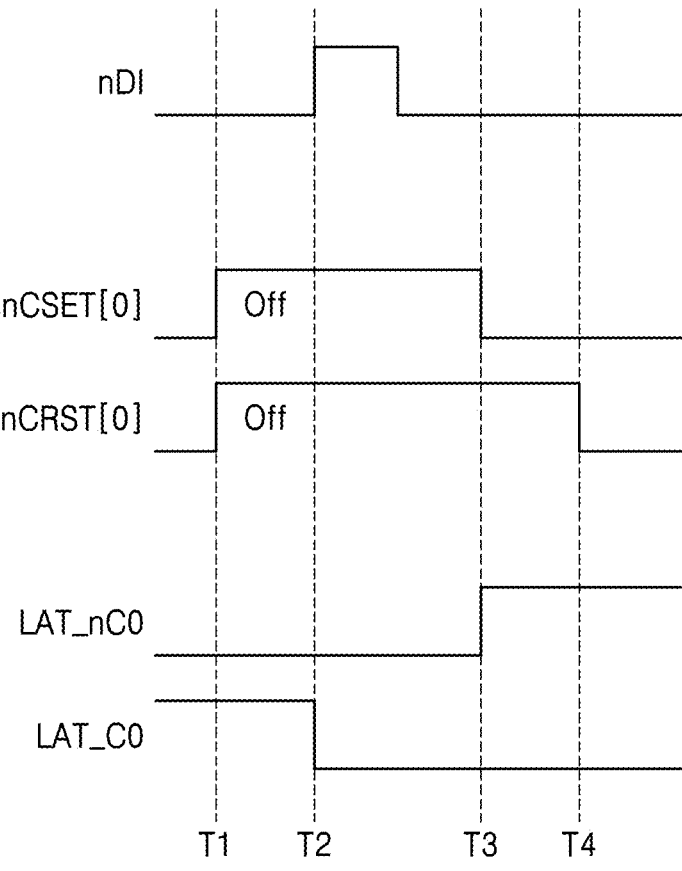
FIG. 24A is a timing diagram of a control operation on a selected cache latch in a data dumping operation according to some implementations.
Figure 24B:
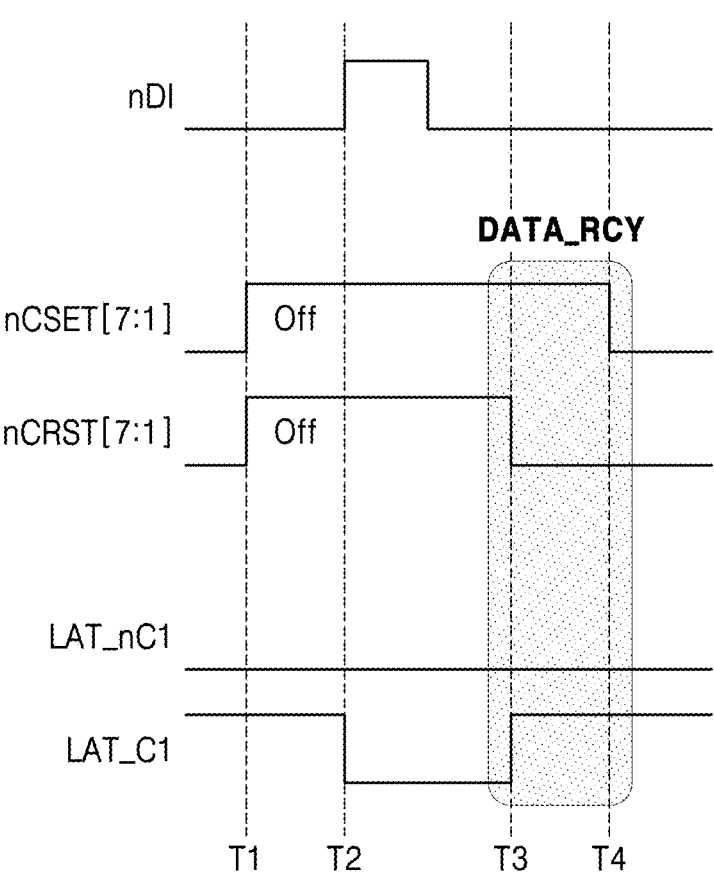
FIG. 24B is a timing diagram of a control operation on an unselected cache latch in a data dumping operation according to some implementations.

FIG. 24A is a timing diagram of a control operation on a selected cache latch in a data dumping operation according to some implementations. FIG. 24B is a timing diagram of a control operation on an unselected cache latch in a data dumping operation according to some implementations. Referring to FIGS. 22, 24A, and 24B together, some implementations may correspond to a modified example of FIGS. 19A and 19B, and the descriptions provided above with reference to FIGS. 19A to 20 may also be applied to the illustrated implementations. Also, some implementations may correspond to a modified example of FIGS. 21A and 21B, and the descriptions provided above with reference to FIGS. 21A to 22 may also be applied to the illustrated implementations.

In a data dumping operation on a selected first cache latch C0, at a first time point T1, a set control signal nCSET[0] and a reset control signal nCRST[0] may transition to a high level, which is a disabled level, and thus, first and second tri-state inverters IVN1 and INV2 may be disabled. At a second time point T2, when a reset signal or a data inverted signal nDI reaches an enabled level, a reset transistor NM14 may be turned on, and second node data LAT_C0 may reach a low level L. In this case, because the set control signal nCSET[0] and the reset control signal nCRST[0] are at a disabled level, both the first and second tri-state inverters INV1 and INV2 may be disabled and may not perform inverting operations. Accordingly, first node data LAT_nC0 may be maintained at the previous level (e.g., a low level).

At a third time point T3, when the set control signal nCSET[0] transitions to a low level, which is an enabled level, the second tri-state inverter INV2 may be enabled. The enabled second tri-state inverter INV2 may invert the second node data LAT_C0, and thus, the first node data LAT_nC0 may transition to a high level H. At a fourth time point T4, when the reset control signal nCRST[0] transitions to a low level, a first tri-state inverter INV1 may be enabled. The enabled first tri-state inverter INV1 may invert the first node data LAT_nC0, and thus, the second node data LAT_C0 may be maintained at a low level.

At the first time point T1, a set control signal nCSET[7:1] and the reset control signal nCRST[7:1] may transition to a high level. At the second time point T2, when the reset signal or the data inverted signal nDI reaches an enabled level, a reset transistor NM14' may be turned on, and fourth node data LAT_C1 may reach the low level L. At the third time point T3, the reset control signal nCRST[7:1] may transition to a low level, and a third tri-state inverter INV3 may be enabled. The enabled third tri-state inverter INV3 may invert undamaged third node data LAT_nC1, and thus, the fourth node data LAT_C1 may be restored to a high level. At the fourth time point T4, the set control signal nCSET[7:1] may transition to a low level, and a fourth tri-state inverter INV4 may be enabled. The enabled fourth tri-state inverter INV4 may invert the restored fourth node data LAT_C1, and the third node data LAT_nC1 may be maintained at a low level.

Figure 25:
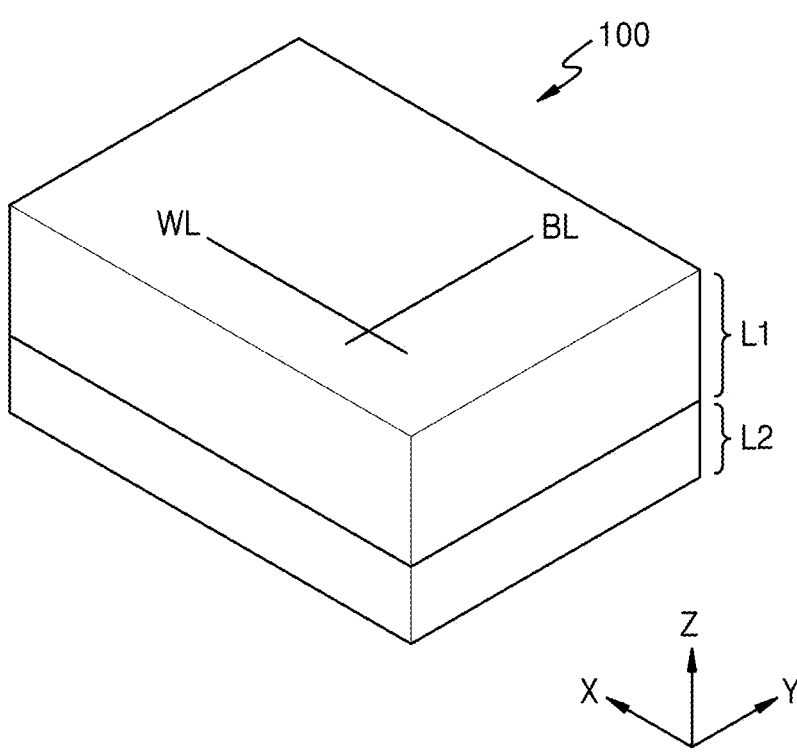
FIG. 25 illustrates a structure of a memory device according to some implementations.

FIG. 25 illustrates a structure of a memory device 100 according to some implementations. Referring to FIGS. 1 and 25 together, the memory device 100 includes a first semiconductor layer L1 and a second semiconductor layer L2, and the first semiconductor layer L1 may be stacked on the second semiconductor layer L2 in a vertical direction Z. Specifically, the second semiconductor layer L2 may be under the first semiconductor layer L1 in the vertical direction Z. In some implementations, the memory cell array 110 may be formed in the first semiconductor layer L1, and a peripheral circuit PECT may be formed in the second semiconductor layer L2. Accordingly, the memory device 100 may have a structure (i.e., a cell over periphery (COP) structure or a bonding VNAND (B-VNAND) structure) in which the memory cell array 110 is arranged on the peripheral circuit PECT.

In the first semiconductor layer L1, bit lines BL may extend in a first direction Y, and word lines WL may extend in a second direction X. The second semiconductor layer L2 may include a substrate. By forming semiconductor devices (e.g., transistors) and a pattern for wiring the semiconductor devices on the substrate, the peripheral circuit PECT may be formed on the second semiconductor layer L2. In some implementations, when the memory device 100 has the COP structure, after the peripheral circuit PECT is formed on the second semiconductor layer L2, the first semiconductor layer L1 including the memory cell array 110 may be formed, and patterns configured to electrically connect the word lines WL and the bit lines BL of the memory cell array 110 to the peripheral circuit PECT formed on the second semiconductor layer L2 may be formed. In some implementations, when the memory device 100 has the B-VNAND structure, the peripheral circuit PECT and lower bonding pads may be formed on the second semiconductor layer L2, and the memory cell array 110 and upper bonding pads may be formed on the first semiconductor layer L1. Thereafter, the upper bonding pads on the first semiconductor layer L1 may be connected to the lower bonding pads on the second semiconductor layer L2 by using a bonding method.

Figure 26:
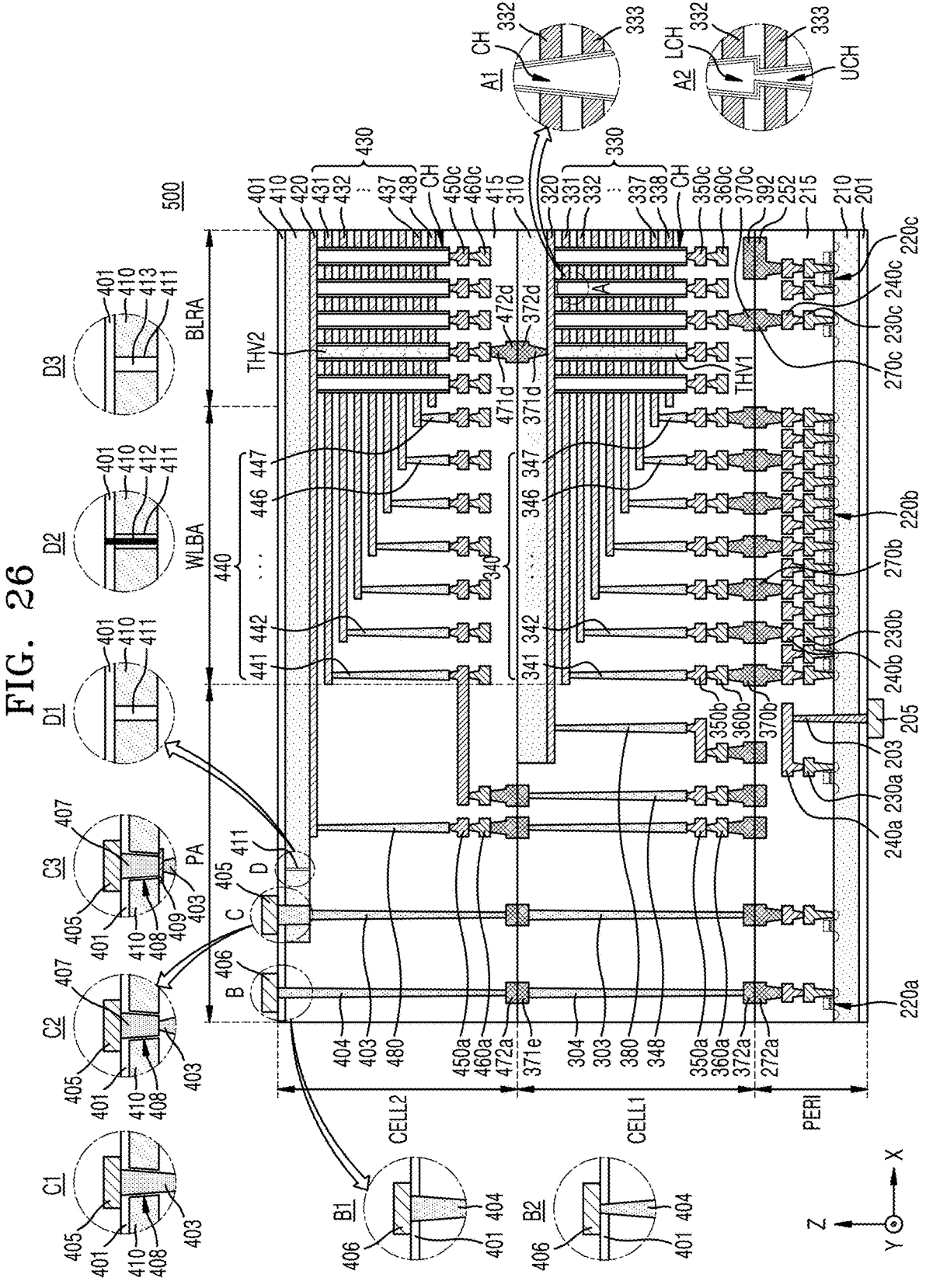
FIG. 26 is a cross-sectional view of a B-VNAND structure according to some implementations.

FIG. 26 is a view illustrating a memory device 500 according to some implementations of the disclosure.

Referring to FIG. 26, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 26, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 26. However, implementations of the disclosure are not limited thereto. In certain implementations, one of the first upper chip and the second upper chip may be turned over and then may be connected to a corresponding chip by the bonding method.

Each of the peripheral circuit region PERI and the first and second cell regions CELL1 and CELL2 of the memory device 500 includes an external pad bonding region PA, a word line bonding region WLBA, and a bit line bonding region BLBA.

The peripheral circuit region PERI includes a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines includes first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in some implementations. However, implementations of the disclosure are not limited thereto. In certain implementations, at least one additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 includes a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 includes a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some implementations, as illustrated in a region 'A1' as an alternative implementation of a region 'A', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some implementations, as illustrated in a region 'A2' as an alternative implementation of a region 'A', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to some implementations may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, implementations of the disclosure are not limited thereto. In certain implementations, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1. For example, the channel structure CH disposed in the second cell area CELL2 may include a data storage layer, a channel layer, and a filling insulation layer, and the channel layer may be electrically connected to a first metal wiring 450c and a second metal wiring 460c in the bit line bonding region BLBA.

In the bit line bonding region BLBA, a first through-electrode THV1 may be provided in the first cell region CELL1, and a second through-electrode THV2 may be provided in the second cell region CELL2. As illustrated in FIG. 26, the first through-electrode THV1 may penetrate the common source line 320 and the plurality of word lines 330. In certain implementations, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some implementations, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 26, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some implementations, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450 and a second metal line 460*a* may be sequentially stacked on the common source line contact plug 480 of the second cell region CELL2.

Input/output pads 205, 405 and 406 may be disposed in the external pad bonding region PA. Referring to FIG. 26, a lower insulating layer 201 may cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some implementations, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some implementations, as illustrated in a region 'B1' as an alternative implementation of the region 'B', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain implementations, as illustrated in a region 'B2' as an alternative implementation of the region 'B', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain implementations, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some implementations, as illustrated in a region 'C1' as an alternative implementation of the region 'C', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, implementations of the disclosure are not limited thereto, and in certain implementations, the diameter of the second input/output contact plug 403 may become progressively less toward the second input/output pad 405.

In certain implementations, as illustrated in a region 'C2' as an alternative implementation of the region 'C', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain implementations illustrated in a region 'C3' as an alternative implementation of the region 'C', a stopper 409 may further be formed on a bottom end of the opening 408 of the third substrate 410, as compared with the implementations of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some implementations, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some implementations, as illustrated in a region 'D1' as an alternative implementation of the region 'D', the slit 411 may be formed to penetrate the third substrate 410. For example, the slit 411 may be used to prevent the third substrate 410 from being finely cracked when the opening 408 is formed. However, implementations of the disclosure are not limited thereto, and in certain implementations, the slit 411 may be formed to have a depth ranging from about 60% to about 70% of a thickness of the third substrate 410.

In certain implementations, as illustrated in a region 'D2' as an alternative implementation of the region 'D', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain implementations, as illustrated in a region 'D3' as an alternative implementation of the region 'D', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain implementations, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some implementations, at least one of the second substrate 310 of the first cell region CELL1 and the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the disclosure has been particularly shown and described with reference to implementations thereof, it will be understood that various changes in form and details may be made therein without departing from the spirit and scope of the following claims.

What is claimed is:

1. A memory device comprising:
   a memory cell array;
   a plurality of page buffer units connected to the memory cell array and connected to a combined sensing node; and
   a plurality of cache latches respectively corresponding to the plurality of page buffer units, the plurality of cache latches comprising a first cache latch and a second cache latch connected to the combined sensing node,
   wherein the first cache latch comprises a first tri-state inverter and a second tri-state inverter, and the second cache latch comprises a third tri-state inverter and a fourth tri-state inverter,
   wherein, during a first section of a data dumping operation on the first cache latch, the first and second tri-state inverters are enabled to transmit data to the first cache latch, and the third and fourth tri-state inverters are disabled, and,
   wherein, during a second section of the data dumping operation on the first cache latch, the third and fourth tri-state inverters are sequentially enabled to restore data previously stored in the second cache latch.

2. The memory device of claim 1, wherein the first and second tri-state inverters are cross-coupled to each other between a first node and a second node, and,
   during the first section, voltages of the first and second nodes are changed according to a voltage of the combined sensing node.

3. The memory device of claim 2, wherein, during the first section, the voltage of the first node is discharged and transitions to a low level, and the voltage of the second node transitions to a high level in response to an inverting operation of the enabled first tri-state inverter.

4. The memory device of claim 2, wherein the third and fourth tri-state inverters are cross-coupled to each other between a third node and a fourth node,
   during the first section, a voltage of the third node is discharged and transitions to a low level, and a voltage of the fourth node is maintained at a previous level by disabling the third and fourth tri-state inverters, and,
   during the second section, the fourth tri-state inverter is enabled, and the voltage of the third node is restored to a high level in response to an inverting operation of the enabled fourth tri-state inverter.

5. The memory device of claim 4, wherein, during the second section, the third tri-state inverter is enabled based on the voltage of the third node being restored to the high level, and the voltage of the fourth node is maintained at a low level in response to an inverting operation of the enabled third tri-state inverter.

6. The memory device of claim 4, wherein the first cache latch further comprises a first set transistor connected to the first node,
   the second cache latch further comprises a second set transistor connected to the third node,
   the first and second set transistors are turned on during the first section, and
   the first and second set transistors are turned off during the second section.

7. The memory device of claim 2, wherein the third and fourth tri-state inverters are cross-coupled to each other between a third node and a fourth node, during the first section, a voltage of the fourth node is discharged and transitions to a low level, and a voltage of the third node is maintained at a previous level, and during the second section, the third tri-state inverter is enabled, and the voltage of the fourth node is restored to a high level in response to an inverting operation of the enabled third tri-state inverter.

8. The memory device of claim 7, wherein, during the second section, the fourth tri-state inverter is enabled based on the voltage of the fourth node being restored to the high level, and the voltage of the third node is maintained at a low level in response to an inverting operation of the enabled fourth tri-state inverter.

9. The memory device of claim 7, wherein the first cache latch further comprises a first reset transistor connected to the second node, the second cache latch further comprises a second reset transistor connected to the fourth node, the first and second reset transistors are turned on during the first section, and the first and second reset transistors are turned off during the second section.

10. The memory device of claim 1, further comprising:

a first transistor having a first gate connected to the combined sensing node, the first transistor being connected to the first cache latch; and a second transistor having a second gate connected to the combined sensing node, the second transistor being connected to the second cache latch, wherein, during the first section, the first and second transistors are turned on according to a voltage of the combined sensing node.

11. The memory device of claim 1, wherein each of the plurality of page buffer units comprises a sensing node and a pass transistor connected to the sensing node, and, in the data dumping operation, sensing nodes respectively included in the plurality of page buffer units are electrically connected to each other by serial connection of pass transistors respectively included in the plurality of page buffer units, and, in a data sensing operation, the pass transistors are turned off, and the sensing nodes are not electrically connected to each other.

12. The memory device of claim 11, wherein the plurality of page buffer units comprise:

a first page buffer unit comprising a first sensing node, a first pass transistor connected to the first sensing node, and a first main latch, wherein the first page buffer unit corresponds to the first cache latch; and a second page buffer unit comprising a second sensing node, a second pass transistor connected to the second sensing node, and a second main latch, wherein the second page buffer unit corresponds to the second cache latch, wherein the data is transmitted from the first main latch to the first cache latch in the data dumping operation.

13. A memory device comprising:

a memory cell array;

a plurality of page buffer units connected to the memory cell array and connected to a combined sensing node; and a plurality of cache latches respectively corresponding to the plurality of page buffer units, the plurality of cache latches being connected to the combined sensing node, wherein the plurality of cache latches comprise:

a first cache latch comprising a first tri-state inverter and a second tri-state inverter; and a second cache latch comprising a third tri-state inverter and a fourth tri-state inverter, wherein, during a first section of a data dumping operation on the first cache latch, the first tri-state inverter is enabled to transmit data to the first cache latch, and the second to fourth tri-state inverters are disabled, and, during a second section of the data dumping operation on the first cache latch, the third and fourth tri-state inverters are sequentially enabled to restore data previously stored in the second cache latch.

14. The memory device of claim 13, wherein the first and second tri-state inverters are cross-coupled to each other between a first node and a second node, and, during the first section, voltages of the first and second nodes are changed according to a voltage of the combined sensing node.

15. The memory device of claim 14, wherein, during the first section, the voltage of the first node is discharged and transitions to a low level, and the voltage of the second node transitions to a high level by an inverting operation of the first tri-state inverter, and, during the second section, the second tri-state inverter is enabled, and the voltage of the first node is maintained at a low level by an inverting operation of the second tri-state inverter.

16. The memory device of claim 14, wherein the third and fourth tri-state inverters are cross-coupled to each other between a third node and a fourth node, during the first section, a voltage of the third node is discharged and transitions to a low level, and a voltage of the fourth node is maintained at a previous level by disabling the third and fourth tri-state inverters, and, during the second section, the fourth tri-state inverter is enabled, and the voltage of the third node is restored to a high level in response to an inverting operation of the enabled fourth tri-state inverter.

17. The memory device of claim 16, wherein, during the second section, the third tri-state inverter is enabled based on the voltage of the third node being restored to the high level, and the voltage of the fourth node is maintained at a low level in response to an inverting operation of the enabled third tri-state inverter.

18. The memory device of claim 16, wherein the first cache latch further comprises a first set transistor connected to the first node, the second cache latch further comprises a second set transistor connected to the third node, the first and second set transistors are turned on during the first section, and the first and second set transistors are turned off during the second section.

19. A memory device comprising:

a memory cell array;

a plurality of page buffer units connected to the memory cell array, wherein the plurality of page buffer units are connected to a combined sensing node; and a plurality of cache latches respectively corresponding to the plurality of page buffer units, wherein the plurality of cache latches are connected to the combined sensing node, wherein the plurality of cache latches comprise:

a first cache latch comprising a first tri-state inverter and a second tri-state inverter; and a second cache latch comprising a third tri-state inverter and a fourth tri-state inverter, wherein the first to fourth tri-state inverters are disabled in a first section of a data dumping operation on the first cache latch, and, during a second section of the data dumping operation on the first cache latch, enabling of the first and fourth tri-state inverters is followed by enabling the second and third tri-state inverters, and data previously stored in the second cache latch is restored.

20. The memory device of claim 19, wherein the third and fourth tri-state inverters are cross-coupled to each other between a third node and a fourth node, during the first section, a voltage of the third node is discharged and transitions to a low level, and a voltage of the fourth node is maintained at a previous level by disabling the third and fourth tri-state inverters, and, during the second section, the fourth tri-state inverter is enabled, and the voltage of the third node is restored to a high level in response to an inverting operation of the enabled fourth tri-state inverter.

* * * * *